(12) United States Patent
Fujita

(10) Patent No.: US 7,193,479 B2
(45) Date of Patent: Mar. 20, 2007

(54) LOCAL OSCILLATOR CIRCUIT

(75) Inventor: Ken Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/972,407

(22) Filed: Oct. 26, 2004

(65) Prior Publication Data

US 2005/0215221 A1    Sep. 29, 2005

(30) Foreign Application Priority Data

Mar. 9, 2004 (JP) ............................. 2004-065462

(51) Int. Cl.
*H03L 7/181* (2006.01)
*H03L 7/097* (2006.01)

(52) U.S. Cl. ..................... 331/16; 327/157; 327/537

(58) Field of Classification Search ............... 331/15, 331/16, 17; 327/157, 537
See application file for complete search history.

(56) References Cited

U.S. PATENT DOCUMENTS 5,534,823 A * 7/1996 Kondou ..................... 331/16
6,462,594 B1 * 10/2002 Robinson et al. ........... 327/159
6,882,238 B2 * 4/2005 Kurd et al. ................. 331/186
6,885,873 B2 * 4/2005 Ravi et al. .................. 455/517

OTHER PUBLICATIONS

J. Craninckx, et al. "CMOS Wireless Frequency Synthesizer Design", Kluwer Academic Publishers, pp. 212-217, 1998.

* cited by examiner

*Primary Examiner*—Benny Lee
*Assistant Examiner*—James Goodley
(74) *Attorney, Agent, or Firm*—Nixon Peabody LLP; Donald R. Studebaker

(57) ABSTRACT

A local oscillator circuit has a control loop that locks the oscillation of a voltage-controlled oscillator at a programmable frequency. The control loop includes a voltage generator that generates a control voltage for the voltage-controlled oscillator, and a current generator that generates a current to raise and lower the control voltage. The magnitude of the current is switched according to the programmed frequency. The magnitude of the current can thereby be adjusted so that the local oscillator circuit achieves lock within a predetermined time, without the need for analog comparison of the control voltage.

11 Claims, 16 Drawing Sheets

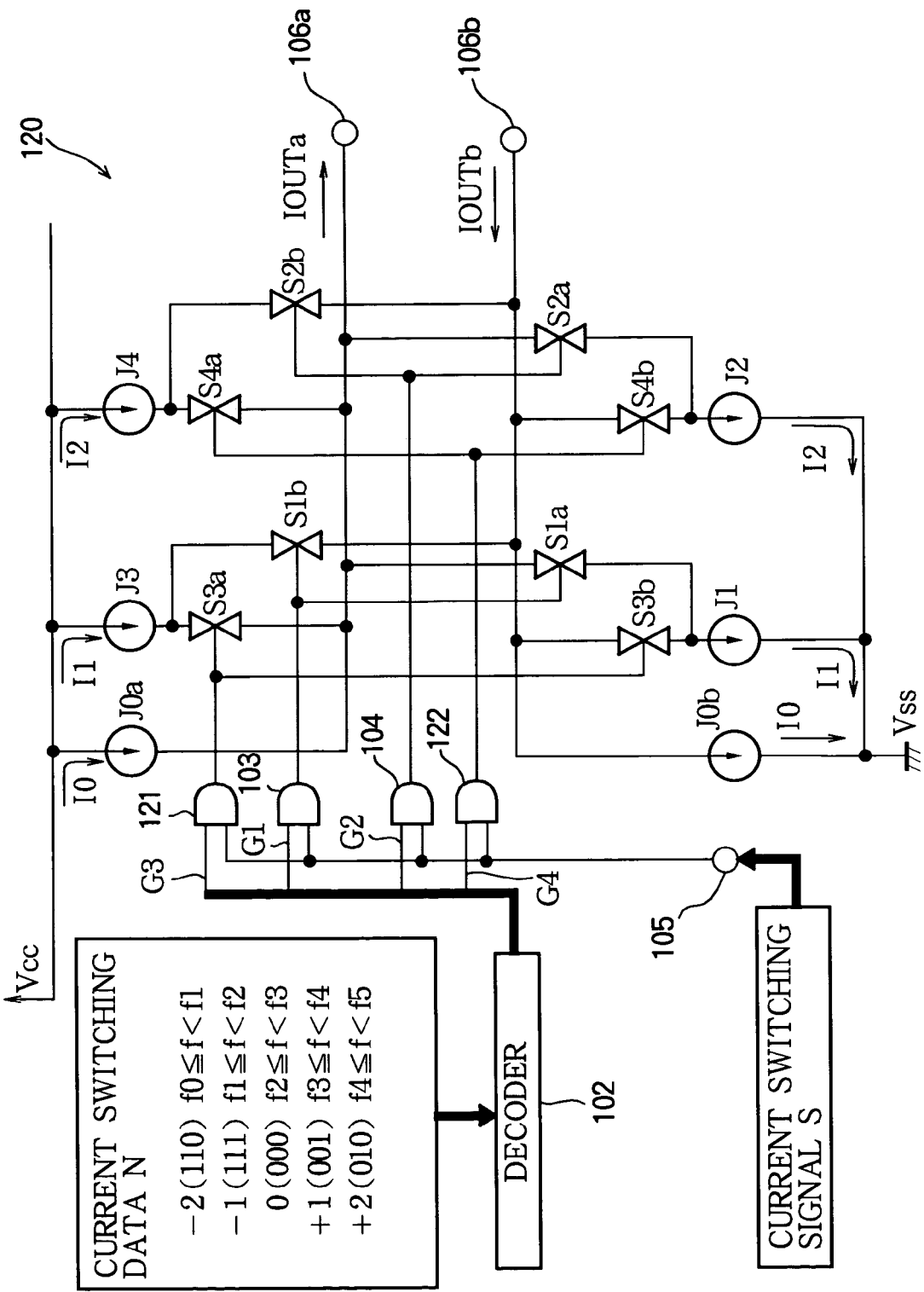

LOCAL OSCILLATOR CIRCUIT

BACKGROUND OF THE INVENTION

1. Field of the Invention

The present invention relates to a local oscillator circuit useful as part of a semiconductor integrated circuit, more particularly to frequency sensitivity compensation in the local oscillator.

2. Description of the Related Art

FIG. 14 shows a block diagram of a conventional local oscillator circuit comprising a phase detector 1, a charge pump 2, a loop filter 3, a voltage-controlled oscillator 4, a prescaler 5, a programmable counter 6, a logic circuit 7, and an analog-to-digital converter (ADC) 8. These circuit elements are connected to form a control loop that locks the output frequency (fout) of the voltage-controlled oscillator 4 at a programmable multiple of a reference frequency fs, as selected by data D output from the logic circuit 7 to the programmable counter 6. All of these circuit elements may be integrated into a semiconductor substrate.

FIG. 15 shows the circuit configuration of the conventional charge pump 2, which comprises an output circuit 101 connected to a current source circuit 200. The current source circuit 200 includes a current source block 200a that feeds current IOUTa into the loop filter 3 to raise the control voltage VC output from the loop filter 3 to the voltage-controlled oscillator 4, and a current source block 200b that draws current IOUTb from the loop filter 3 to lower the control voltage VC.

FIG. 16 shows a circuit diagram of the analog-to-digital converter 8 and the current source circuit 200 in the conventional local oscillator circuit. The analog-to-digital converter 8 comprises comparators 801, 802, 803, resistors 804, 805, 806, 807, and an input terminal 808 receiving the control voltage VC. The current source circuit 200 includes current sources J1a, J1b, J2a, J2b, J3a, J3b, analog switches S1a, S1b, S2a, S2b, S3a, S3b, a terminal 106a for feeding current IOUTa, and a terminal 106b for drawing current IOUTb. Analog switches S1a and S1b may be omitted, as in FIG. 15. (For further information, see J. Craninckx and M. Steyaert, *CMOS Wireless Frequency Synthesizer Design*, Kluwer Academic Publishers, 1998).

If K indicates the frequency sensitivity of the voltage-controlled oscillator 4 (measured in hertz per volt) IOUT indicates current output from the charge pump 2, and f indicates the programmed frequency setting, then the lock time (the length of time needed by the local oscillator circuit to bring the output frequency fout to the frequency setting f) is directly proportional to the reciprocal of the product K×IOUT of the frequency sensitivity K and current IOUT. If the output frequency fout is externally perturbed away from the frequency setting f, the recovery time (the time needed to restore fout to f) is also directly proportional to the reciprocal of the product K×IOUT.

FIGS. 17A and 17B illustrate operating characteristics of the conventional local oscillator circuit in FIG. 14: FIG. 17A shows how the output frequency fout varies with the control voltage VC in the voltage-controlled oscillator 4; FIG. 17B shows how the output current IOUT varies with the control voltage VC. As is clear from the curve in FIG. 17A, the voltage-controlled oscillator 4 varies its output frequency fout responsive to the control voltage VC, raising the output frequency fout as the control voltage VC rises, but the frequency sensitivity K, defined as the slope of the curve in FIG. 17A, also varies with the control voltage VC of the voltage-controlled oscillator 4: the higher the control voltage VC is (the higher the output frequency fout), the lower the frequency sensitivity K becomes.

If the current IOUT output from the charge pump 2 does not vary according to the output frequency fout, but has a constant value as illustrated by the dotted line B' in FIG. 17B, then since the frequency sensitivity K varies with the control voltage VC and the output frequency fout, the lock time and recovery time vary according to the frequency setting f: the higher the frequency setting f, the longer the lock time and recovery time become. If the product K X IOUT of frequency sensitivity K and current IOUT does not vary with the control voltage VC, but has a constant value, then the lock time and recovery time do not vary according to the frequency setting f.

Accordingly, in the circuit diagram shown in FIG. 16, comparators 801, 802, and 803 detect the control voltage VC, and the current IOUT output from the charge pump 2 is adjusted according to the detected control voltage VC as illustrated by curve B in FIG. 17B, so that the lock time in the conventional local oscillator circuit in FIG. 14 does not vary according to the frequency setting f. Although three comparators are shown in FIG. 16, actual circuits generally have five or more comparators.

Since the plurality of comparators in the analog-to-digital converter 8 operate constantly, they consume power constantly, which is a disadvantage. Power is also consumed constantly by the resistor ladder comprising resistors 804, 805, 806, 807.

SUMMARY OF THE INVENTION

An object of the present invention is accordingly to reduce the power consumption of a local oscillator circuit.

The invented local oscillator circuit includes a phase detector, a current generator such as a charge pump, a control voltage generator such as a loop filter, a voltage-controlled oscillator, and a frequency divider including, for example, a prescaler and a programmable counter. The frequency divider divides the frequency of the signal output by the voltage-controlled oscillator by a selectable frequency division ratio, which is programmed according to a frequency setting. The output frequency of the voltage-controlled oscillator is controlled by a control voltage output by the voltage generator. The control voltage is adjusted by the current output by the current generator. The magnitude of the current is switched according to the programmed frequency setting, instead of being switched according to the control voltage.

The effect of the invention is that less power is consumed, because no analog voltage comparison circuits are required.

BRIEF DESCRIPTION OF THE DRAWINGS

In the attached drawings:

FIG. 9 is a circuit diagram illustrating a current source in the charge pump in a second embodiment;

DETAILED DESCRIPTION OF THE INVENTION

Figure 1:
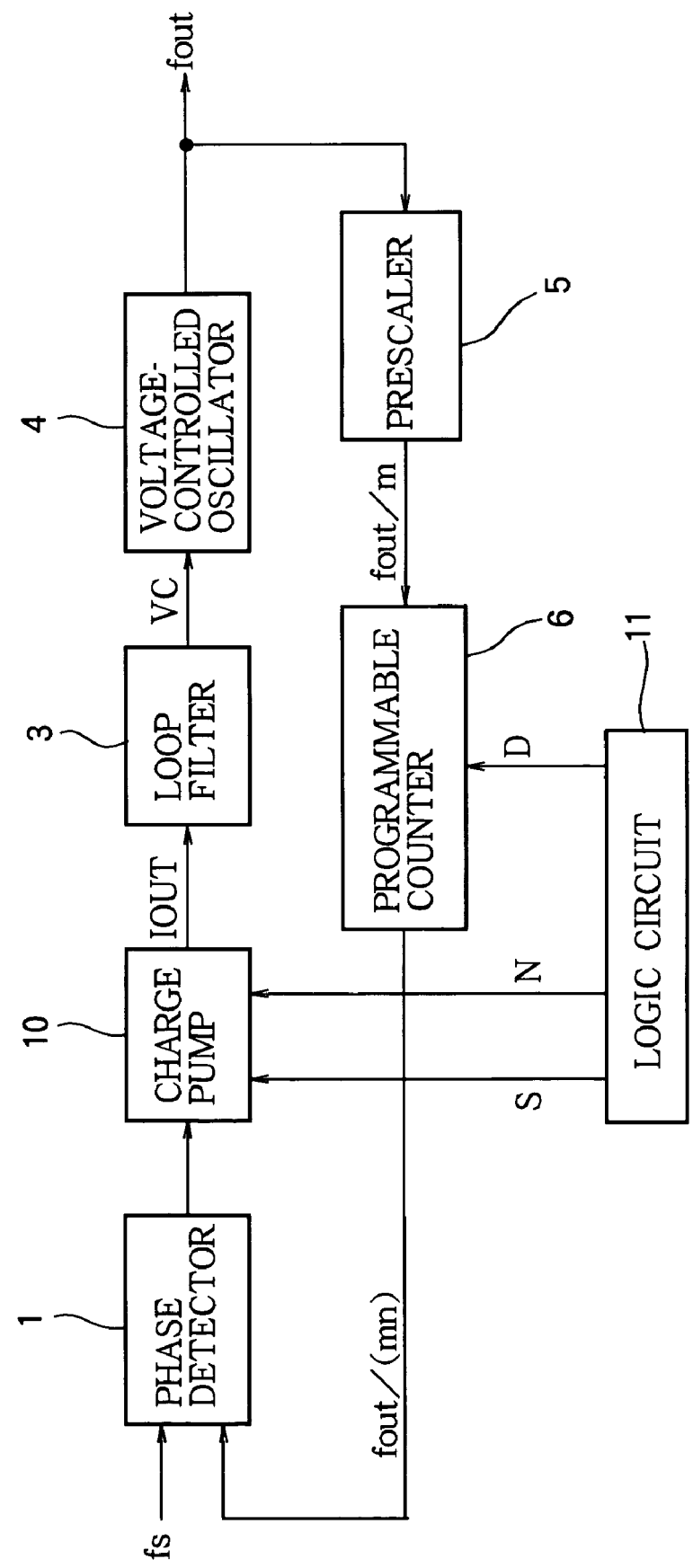
FIG. 1 is a block diagram of a local oscillator circuit illustrating a first embodiment of the present invention.

Embodiments of the invention will now be described with reference to the attached drawings, in which like elements are indicated by like reference characters.

First Embodiment

Figure 14:
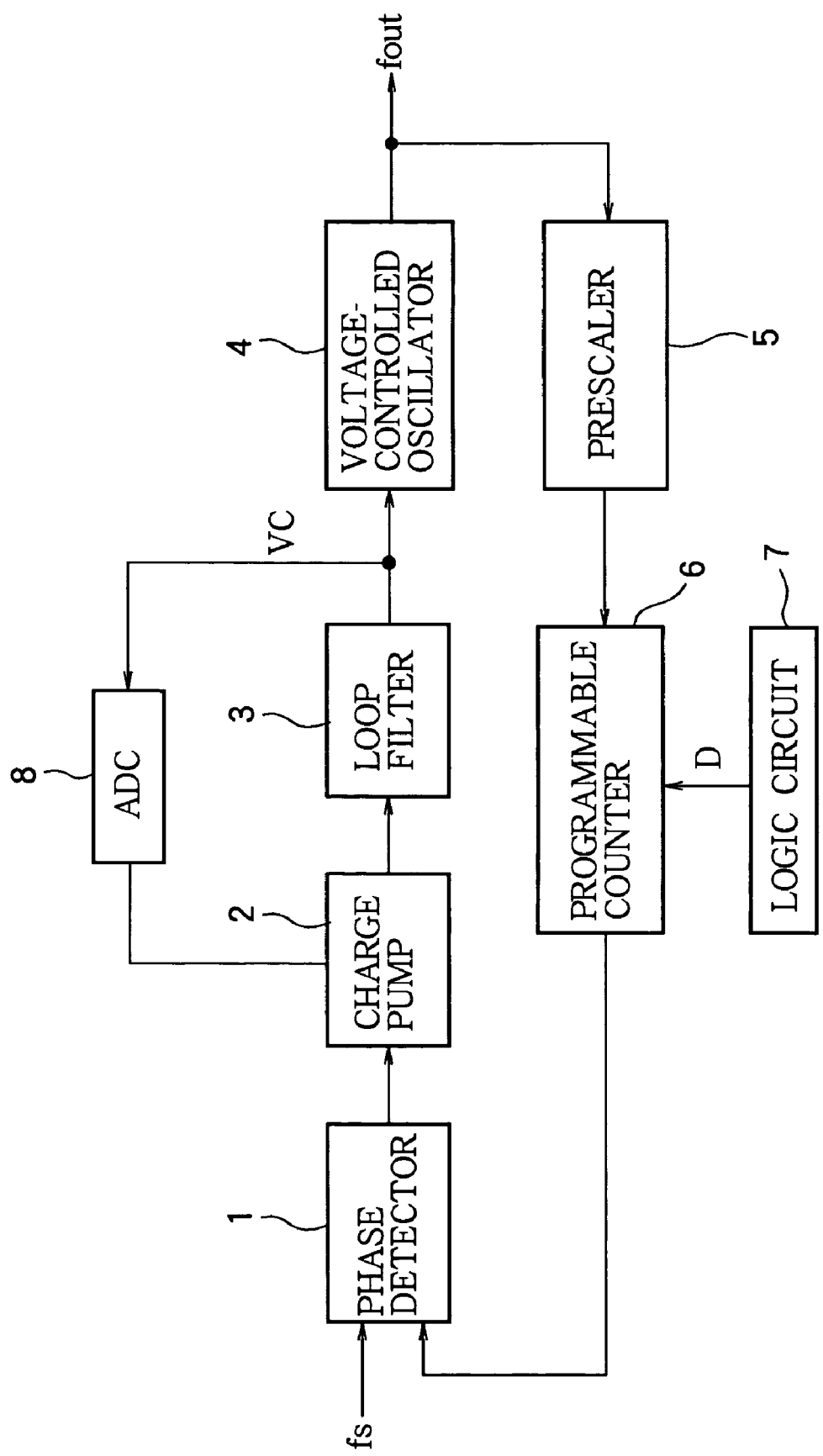
FIG. 14 is a block diagram of a conventional local oscillator circuit.
Figure 15:
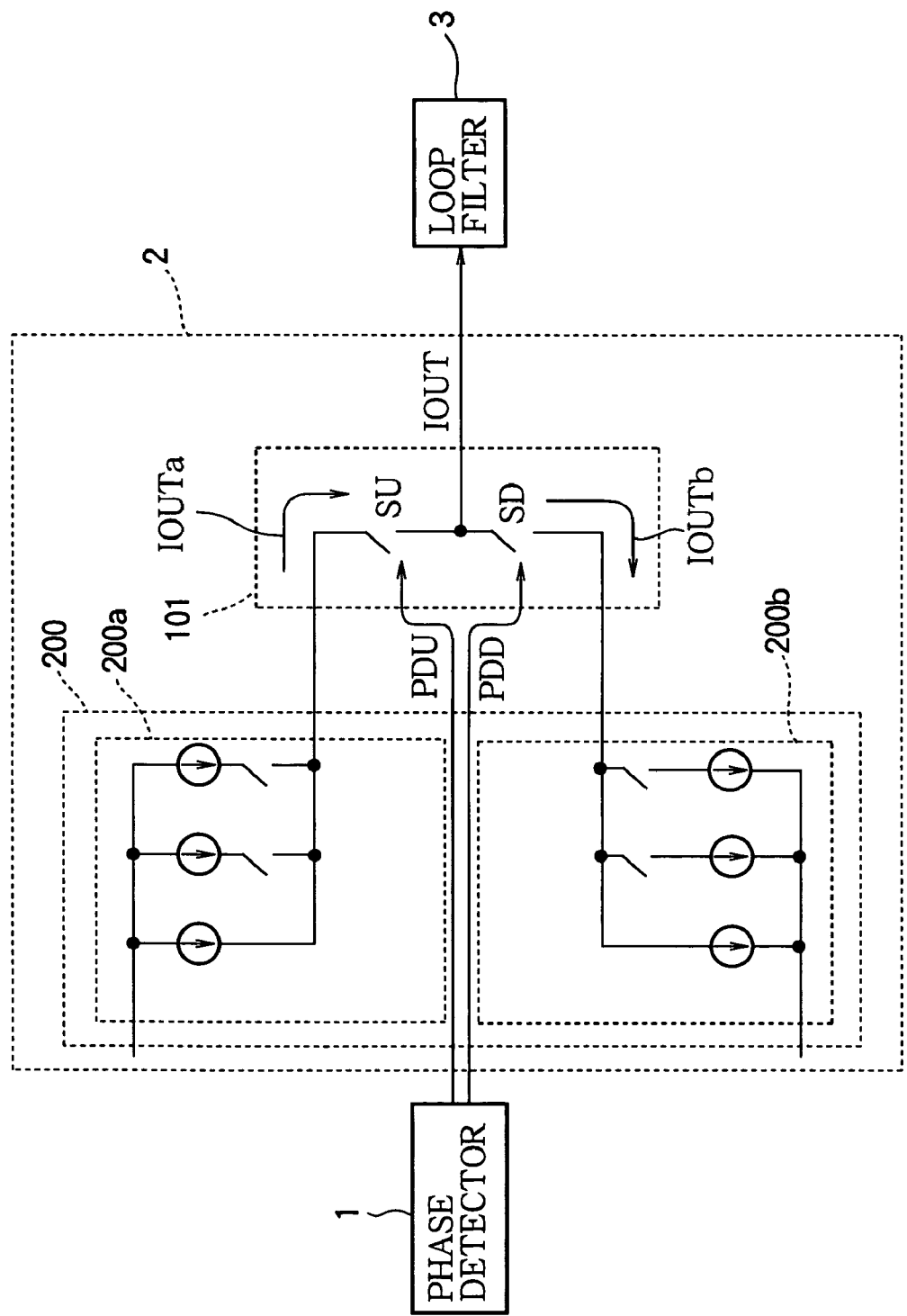
FIG. 15 is a schematic drawing of the charge pump in the conventional local oscillator circuit.

Referring to FIG. 1, a local oscillator circuit according to a first embodiment of the invention comprises a phase detector 1, a loop filter 3, a voltage-controlled oscillator 4, a prescaler 5, a programmable counter 6, a charge pump 10, and a logic circuit 11. Differing from the conventional local oscillator circuit in FIG. 14, there is no analog-to-digital converter, and the charge pump 10 and logic circuit 11 differ from the conventional charge pump 2 and logic circuit 7.

Phase Detector

The phase detector 1 receives a reference frequency signal and a divided signal, compares them, detects the phase difference between them, and supplies the charge pump 10 with a pair of phase detection signals PDU and PDD responsive to the phase difference. The reference frequency signal is obtained from, for example, a crystal oscillator and a reference frequency divider (not shown), and has a frequency fs. The divided signal is obtained from the programmable counter 6 and has a frequency of fout/(m×n), where fout is the output frequency of the local oscillator circuit and m and n are frequency division ratios described below.

Charge Pump

Figure 2:
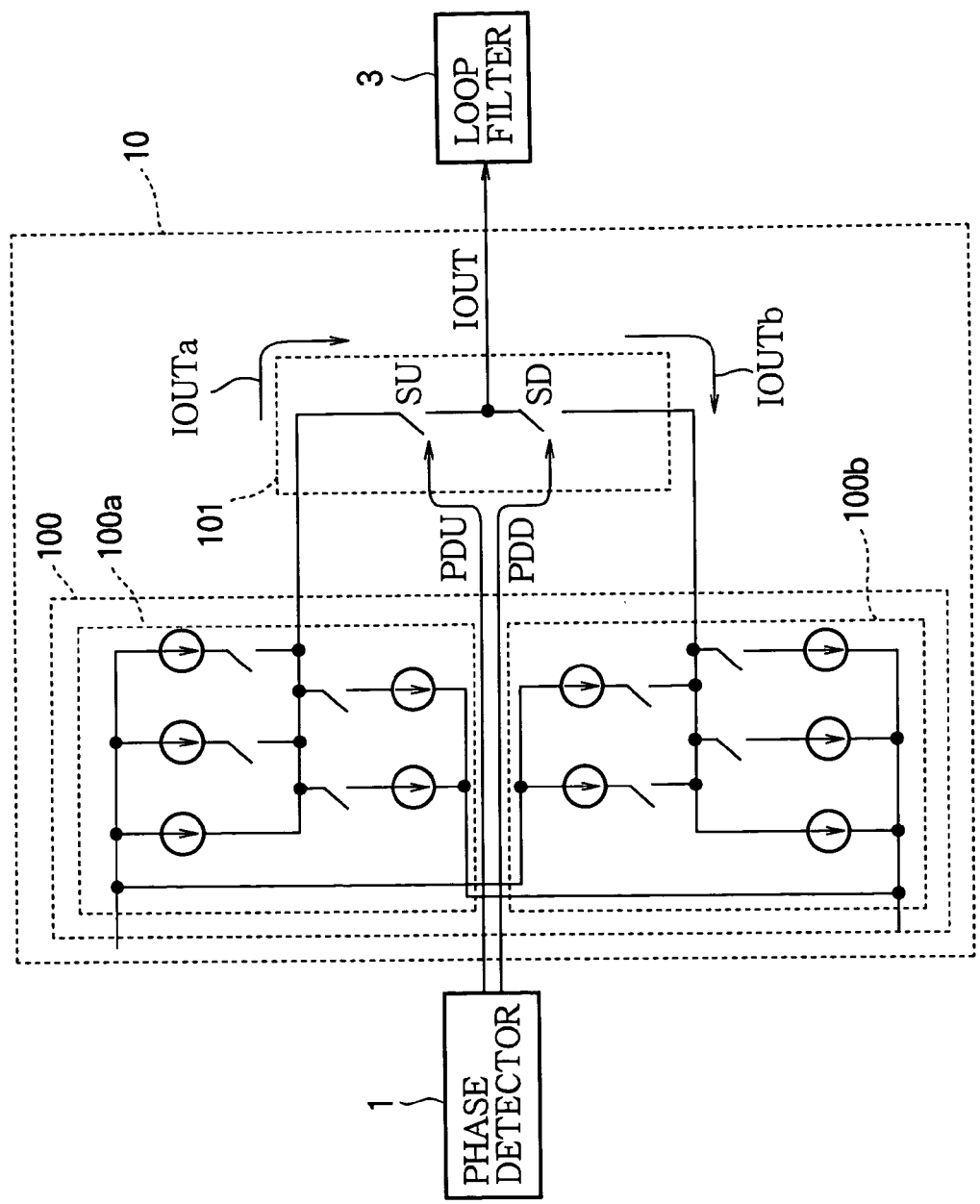
FIG. 2 schematically shows the configuration of the charge pump in the first embodiment.

FIG. 2 shows the circuit configuration of the charge pump 10 in the first embodiment. The charge pump 10 comprises an output circuit 101 connected to a current source circuit 100. The current source circuit 100 includes a pair of current source blocks 100a, 100b. Operating according to the phase detection signals PDU and PDD from the phase detector 1, current source block 100a feeds current (IOUT, also designated IOUTa) into the loop filter 3 to raise the control voltage VC output from the loop filter 3 to the voltage-controlled oscillator 4; current source block 100b draws current (IOUT, also designated IOUTb) from the loop filter 3 to lower the control voltage VC.

The output circuit 101 includes a pair of analog switches SU and SD: analog switch SU is turned on or off responsive to phase detection signal PDU from the phase detector 1; analog switch SD is turned on or off responsive to phase detection signal PDD from the phase detector 1. The analog switches SU and SD are controlled by the phase detection signals PDU and PDD so that either analog switch SU is turned on, or analog switch SD is turned on, or both analog switches SU and SD are turned off. If analog switch SU is turned on, IOUT is positive: current IOUTa is fed from current source block 100a to the loop filter 3 and the control voltage VC is pumped up. If analog switch SD is turned on, IOUT is negative: current IOUTb is drawn from the loop filter 3 into current source block 100b and the control voltage VC is pumped down.

Loop Filter

The loop filter 3 supplies the voltage-controlled oscillator 4 with the control voltage VC, which is raised and lowered by the current IOUT output from the charge pump 10. When IOUT is positive and (IOUTa), the loop filter 3 raises the control voltage VC; when IOUT is equal to zero, the loop filter 3 leaves the control voltage VC at its existing value; when IOUT is negative (IOUTb), the loop filter 3 lowers the control voltage VC.

Voltage-Controlled Oscillator

Figure 3:
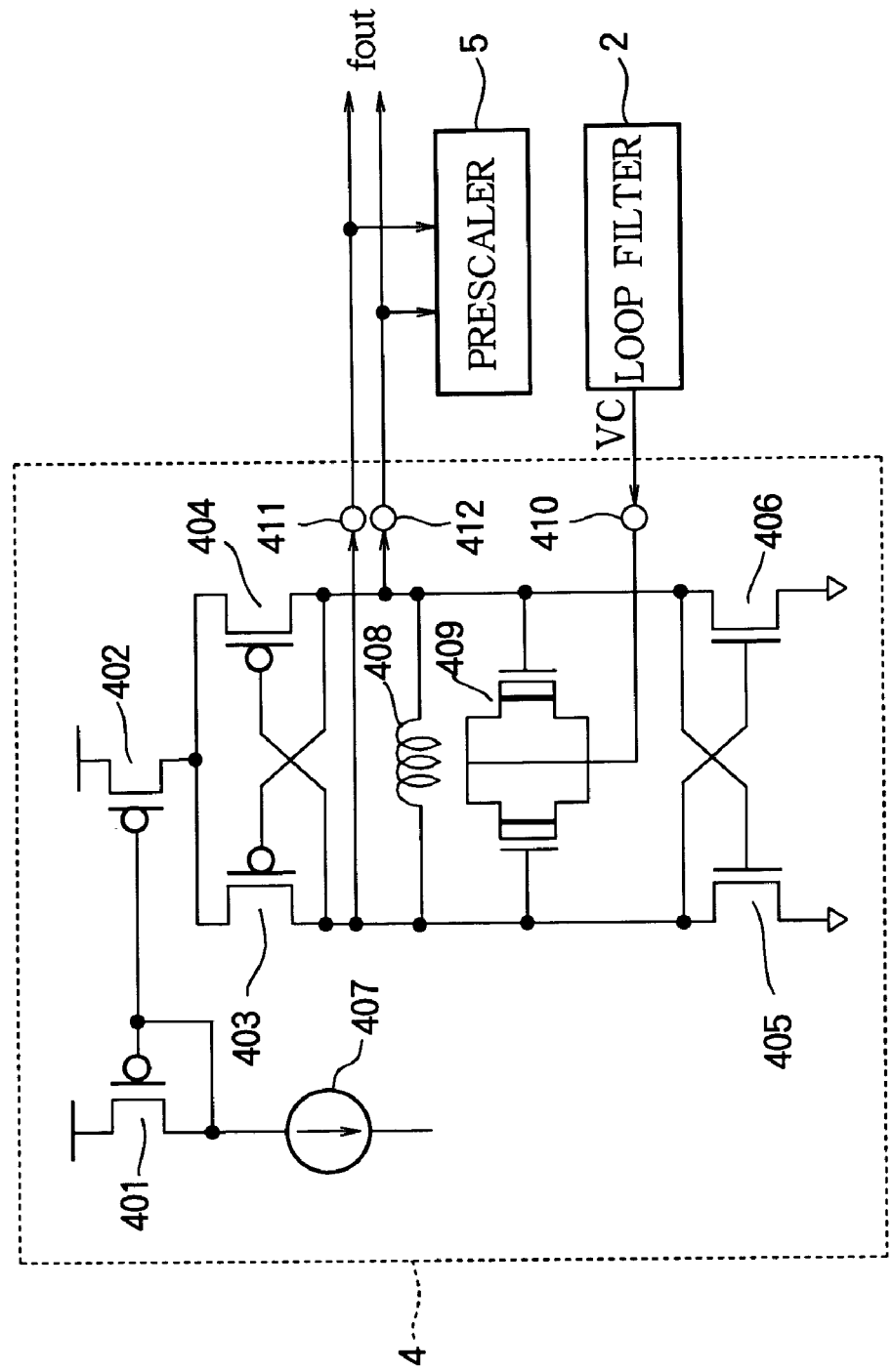
FIG. 3 is a circuit diagram of the voltage-controlled oscillator in the local oscillator circuit.

FIG. 3 shows a circuit diagram of the voltage-controlled oscillator 4. The voltage-controlled oscillator 4 comprises p-channel metal-oxide-semiconductor (MOS) field-effect transistors (FETs) 401, 402, 403, and 404, a pair of n-channel MOS FETs 405 and 406, a constant current source 407, an inductor 408, a variable capacitor 409, an input terminal 410 receiving the control voltage VC, and a pair of differential output terminals 411, 412 for output of a differential signal having a frequency fout nominally equal to fs×m×n. The voltage-controlled oscillator 4 generates this differential signal by oscillating at a frequency responsive to the control voltage VC input from the loop filter 3 to the variable capacitor 409: if the control voltage VC rises, the oscillation frequency increases; if the control voltage VC falls, the oscillation frequency decreases. The differential output signal is also input to the prescaler 5.

Prescaler

The prescaler 5 divides the frequency fout of the signal input from the voltage-controlled oscillator 4 by a fixed frequency division ratio or divisor m, and outputs a divided signal with frequency fout/m to the programmable counter 6.

Programmable Counter

The programmable counter 6 additionally divides the frequency fout/m of the signal input from the prescaler 5 by a programmable frequency division ratio or divisor n, and outputs a divided signal with frequency fout/(m×n) to the phase detector 1. The divisor n is programmed by frequency division data D input from the logic circuit 11.

Logic Circuit

The logic circuit 11 generates the frequency division data D according to a frequency setting f, and outputs the generated frequency division data D to the programmable counter 6. The logic circuit 11 also generates current switching data N according to the frequency setting f, generates a current switching signal S according to the progress of the local oscillator circuit toward bringing the output frequency fout to the frequency setting f, and outputs the generated current switching data N and current switching signal S to the charge pump 10.

fout v. VC Characteristic

Figure 4:
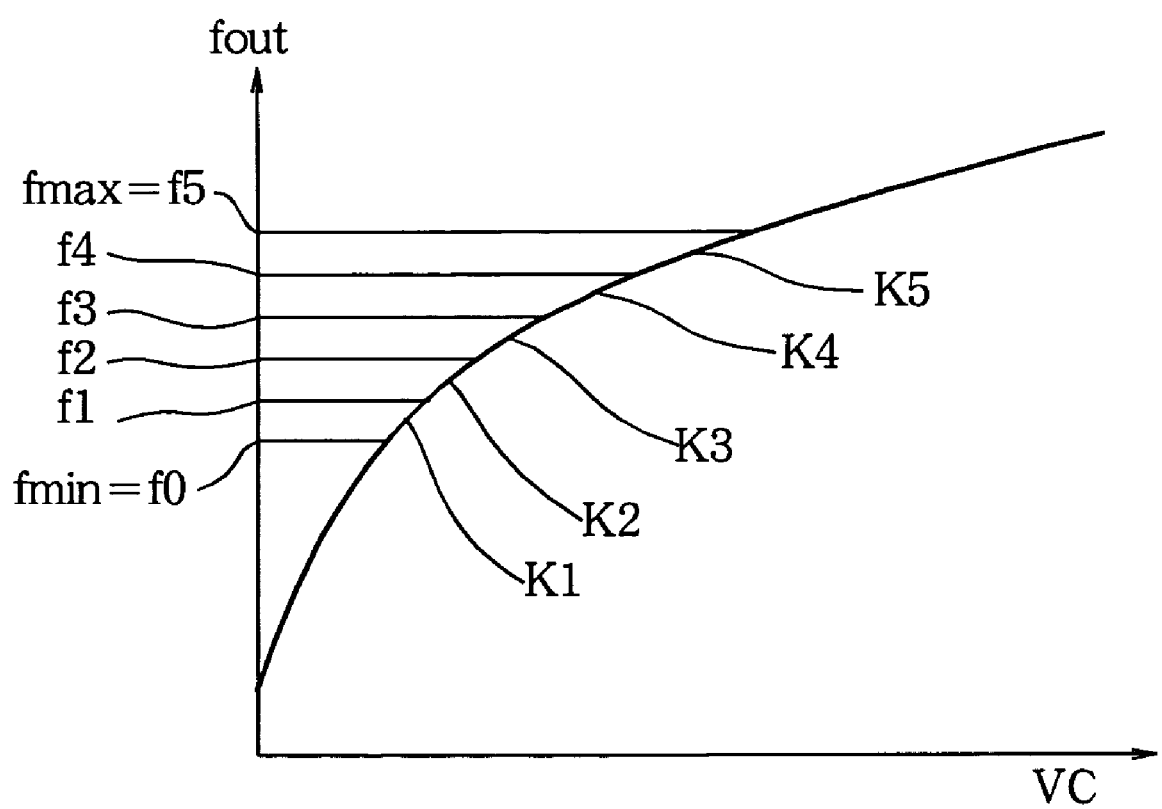
FIG. 4 shows an output frequency v. control voltage characteristic of the voltage-controlled oscillator.

FIG. 4 shows how the output frequency fout of the voltage-controlled oscillator 4 depends on the control voltage VC. The frequency sensitivity K is the slope of the curve in FIG. 4, and varies with the frequency fout approximately as follows, where f0 is the minimum output frequency, f5 is the maximum output frequency, and f1–f4 are equally spaced between f0 and f5.

| | |
|---|---|
| f0 ≤ fout < f1 | K = K1 = 160 MHz/V |
| f1 ≤ fout < f2 | K = K2 = 110 MHz/V |
| f2 ≤ fout < f3 | K = K3 = 80 MHz/V |
| f3 ≤ fout < f4 | K = K4 = 65 MHz/V |
| f4 ≤ fout < f5 | K = K5 = 40 MHz/V |

Current Switching Data N

The logic circuit 11 divides the frequency range from the minimum frequency fmin=f0 to the maximum frequency fmax=f5 into the five frequency regions indicated in FIG. 4 (a frequency region f0–f1 in which the frequency sensitivity K is K1, a frequency region f1–f2 in which the frequency sensitivity K is K2, a frequency region f2–f3 in which the frequency sensitivity K is K3, a frequency region f3–f4 in which the frequency sensitivity K is K4, and a frequency region f4–f5 in which the frequency sensitivity K is K5) and generates three-bit current switching data N according to the one of the five divided frequency regions to which the frequency setting f belongs. Accordingly, current switching data N indicates the frequency division ratio m×n of the prescaler 5 and programmable counter 6, that is, the frequency setting f and the frequency division ratio n in the programmable counter 6. The current switching data N varies with the frequency setting f as follows.

| | |
|---|---|
| f0 ≤ f < f1 | N = −2 (110) |
| f1 ≤ f < f2 | N = −1 (111) |
| f2 ≤ f < f3 | N = 0 (000) |
| f3 ≤ f < f4 | N = +1 (001) |
| f4 ≤ f < f5 | N = +2 (010) |

Frequency Locking Operation

Figure 5:
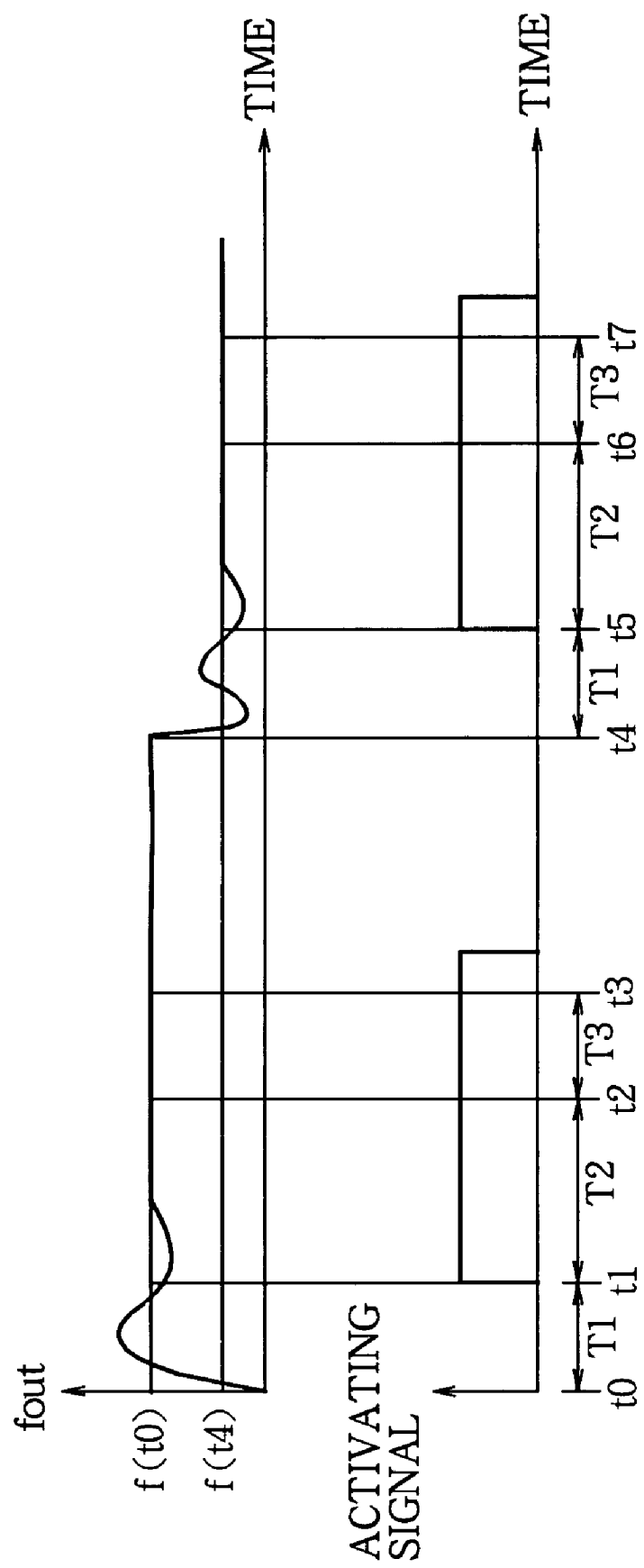
FIG. 5 is a timing diagram showing how the output frequency is brought to the frequency setting in the first embodiment.

FIG. 5 is a timing diagram showing how the local oscillator circuit brings the output frequency to the frequency setting in the first embodiment: the upper waveform indicates the frequency fout of the signal output from the local oscillator circuit; the lower waveform is the waveform of an activating signal that activates a power amplifier for signal transmission or a low-noise amplifier for signal reception in a wireless communication device or other such device in which the local oscillator circuit in the first embodiment is used. T1 and T2 indicate first and second frequency lock times. The sum of the lengths of the first and second frequency lock times (T1+T2) is the time needed by the local oscillator circuit to bring the frequency fout of the output signal to the frequency setting f(t0) made at timing t0 or the frequency setting f(t4) made at timing t4. T3 indicates the (length of the) communication interval in which the communication device or other device including this local oscillator circuit performs data communication or other operations. The first frequency lock time T1 and the second frequency lock time T2 vary from one frequency locking operation to another according to the frequency setting f and other factors, and the communication time T3 also varies at each data communication interval.

When frequency f(t0) is selected at timing t0 in FIG. 5, the local oscillator circuit sets a frequency division ratio n(t0) corresponding to this frequency setting f(t0) in the programmable counter 6, starts the frequency locking operation, brings the output frequency fout to the frequency setting f(t0), and completes the frequency locking operation at timing t2, when the first and second frequency lock times (T1+T2) have elapsed from the starting timing t0. This operation locks the frequency fout/(m×n(t0)) and phase of the divided signal output from the programmable counter 6 to the frequency fs and phase of the reference frequency signal, thereby locking the output frequency fout at fs×m×n(t0), which is equal to the frequency setting f(t0). The local oscillator circuit carries out data communication or other operations from timing t2, when the frequency locking operation is completed, to timing t3, when the communication time T3 has elapsed.

When a different frequency f(t4) is selected at timing t4 in FIG. 5, the local oscillator circuit sets a frequency division ratio n(t4) corresponding to this frequency setting f(t4) in the programmable counter 6, starts the frequency locking operation, brings the output frequency fout to the frequency setting f(t4), and completes the frequency locking operation at timing t6, when the first and second frequency lock times (T1+T2) have elapsed from timing t4. This operation locks the frequency fout/(m×n(t4)) and phase of the divided signal output from the programmable counter 6 to the frequency fs and phase of the reference frequency signal, thereby locking the output frequency fout at fs×m×n(t4), which is equal to the frequency setting f(t4). The local oscillator circuit carries out data communication or other operations from timing t6, when the frequency locking operation is completed, to timing t7, when the communication time T3 has elapsed.

In the frequency locking operation described above, the first frequency lock time (T1) is the time until the frequency deviation (fout−f) of the output frequency fout from the frequency setting f satisfies the condition below, in which frequencies f0 and f1 are as shown in FIG. 4.

$$-2\times(f0-f1)\leq fout-f\leq +2\times(f0-f1)$$

The second frequency lock time (T2) is the interval from the time when the condition above is satisfied to the time when the frequency locking operation is completed.

The activating signal rises from 0 V to a higher level at timings t1 and t5, when the frequency locking operation proceeds from the first frequency lock time (T1) to the second frequency lock time (T2), and returns to 0 V awhile after the data communication intervals end at timings t3 and t7 in FIG. 5.

Current Switching Signal S

The logic circuit 11 generates a one-bit current switching signal S according to the elapsed time from the start of the frequency locking operation, the frequency deviation of the output frequency fout from the frequency setting f during the frequency locking operation, or any other relevant factor. The activating signal in FIG. 5 may be used as the current switching signal S; this will be assumed in the following description. The current switching signal S is accordingly '0' during the first frequency lock time (T1), and '1' during the second frequency lock time (T2).

Current Source Circuit in Charge Pump

Figure 6:
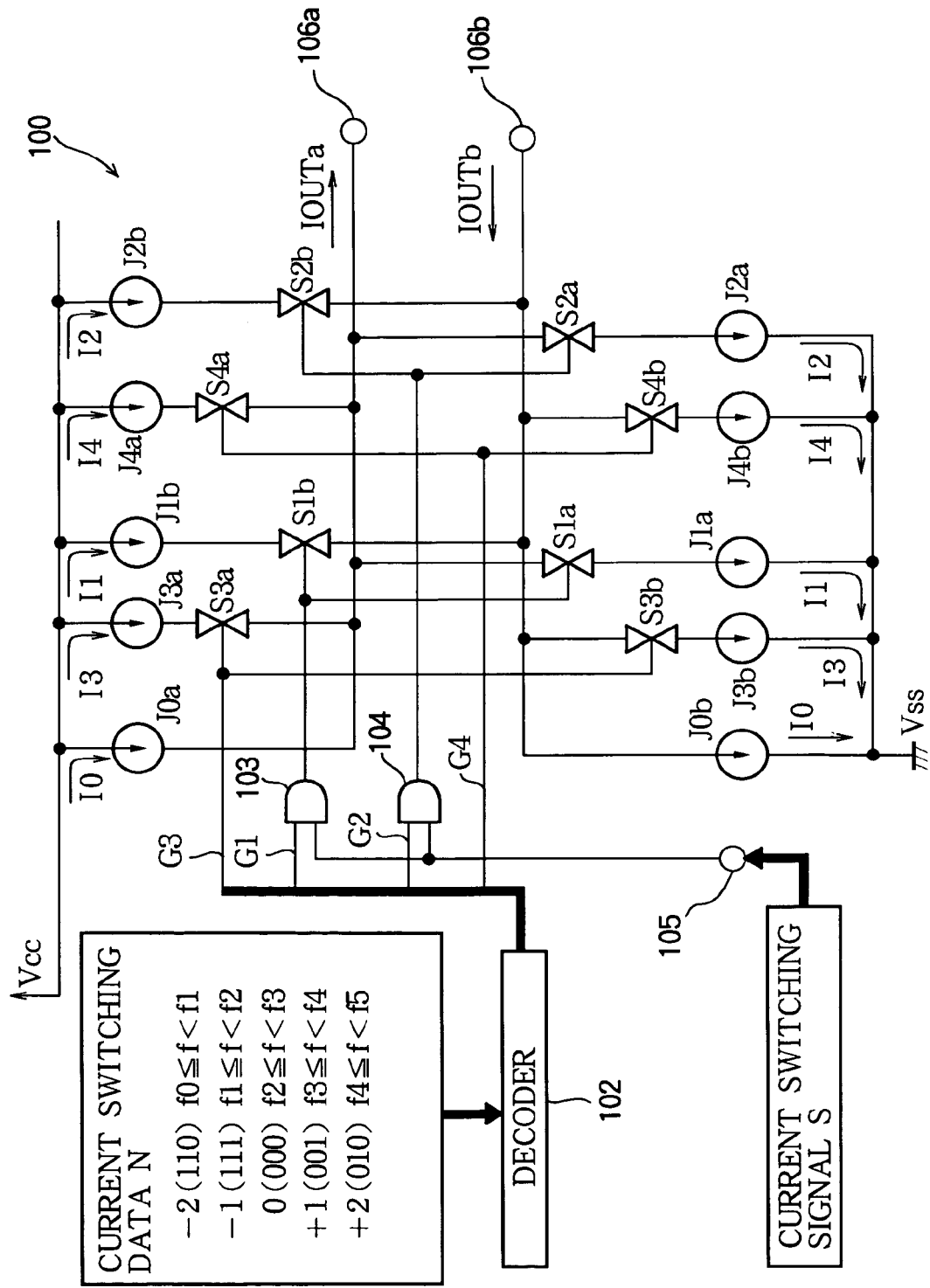
FIG. 6 is a circuit diagram illustrating the current source circuit in the first embodiment.

FIG. 6 shows a circuit diagram of the current source circuit 100 in the charge pump 10 in the first embodiment. The current source circuit 100 includes current sources J0a, J0b, J1a, J1b, J2a, J2b, J3a, J3b, J4a, J4b, analog switches S1a, S1b, S2a, S2b, S3a, S3b, S4a, S4b, a decoder 102 for current switching data N, a pair of AND gates 103, 104, an input terminal 105 receiving the current switching signal S, a terminal 106a for feeding current IOUTa, and a terminal 106b for drawing current IOUTb.

Current source J0a, the series circuit comprising current source J3a and analog switch S3a, and the series circuit comprising current source J4a and analog switch S4a are connected in parallel between the power supply (Vcc) and terminal 106a; the series circuit comprising current source J1a and analog switch S1a and the series circuit comprising current source J2a and analog switch S2a are connected in parallel between terminal 106a and ground (Vss).

The current source J0b, the series circuit comprising current source J3b and analog switch S3b, and the series circuit comprising current source J4b and analog switch S4b are connected in parallel between terminal 106b and ground (Vss); the series circuit comprising current source J1b and analog switch S1b and the series circuit comprising current source J2b and analog switch S2b are connected in parallel between the power supply (Vcc) and terminal 106b.

AND gate 103 receives the current switching signal S and a decoded signal G1 from the decoder 102; the signal output from AND gate 103 is input to the control terminals of analog switches S1a and S1b. AND gate 104 receives the current switching signal S and a decoded signal G2 from the decoder 102; the signal output from AND gate 104 is input to the control terminals of analog switches S2a and S2b. A decoded signal G3 from the decoder 102 is input to the control terminals of analog switches S3a and S3b; a decoded signal G4 from the decoder 102 is input to the control terminals of analog switches S4a and S4b.

The current source block 100a that feeds current IOUTa to the loop filter 3 to raise the control voltage VC in the voltage-controlled oscillator 4 comprises current sources J0a, J1a, J2a, J3a, J4a, analog switches S1a, S2a, S3a, S4a, AND gates 103, 104, and the decoder 102; the current source block 100b that draws current IOUTb from the loop filter 3 to lower the control voltage VC in the voltage-controlled oscillator 4 comprises current source J0b, J1b, J2b, J3b, J4b, analog switches S1b, S2b, S3b, S4b, AND gates 103, 104, and the decoder 102.

Current sources J0a, J1b, J2b, J3a, and J4a include p-channel FETs (not shown); current sources J0b, J1a, J2a, J3b, and J4b include n-channel FETs (not shown). The differences between the current source blocks 100a and 100b in FIG. 6 are that current sources J0a, J3a, and J4a include p-channel FETs instead of n-channel FETs, and are connected to the power supply (Vcc) instead of ground (Vss), whereas current sources J1a and J2a include n-channel FETs instead of p-channel FETs and are connected to ground (Vss) instead of the power supply (Vcc).

The decoded signals G1, G2, G3, G4 from the decoder 102 and the current switching signal S control the switching of analog switches S1a, S1b, S2a, S2b, S3a, S3b, S4a, S4b so that the current IOUTa fed to the loop filter 3 when analog switch SU in the output circuit 101 (in FIG. 2) is in the conducting state and the current IOUTb drawn from the loop filter 3 when analog switch SD in the output circuit 101 is in the conducting state have the same value. The currents supplied from the current sources have, for example, the following values:

Current I0 of current sources J0a and J0b=200 µA
Current I1 of current sources J1a and J1b=40 µA
Current I2 of current sources J2a and J2b=60 µA
Current I3 of current sources J3a and J3b=70 µA
Current I4 of current sources J4a and J4b=130 µA The current I0 supplied by current sources J0a and J0b is set to 200 µA so that the frequency locking operation ends in a predetermined time when the frequency sensitivity K of the frequency setting f in the voltage-controlled oscillator 4 is the median value K3 in FIG. 4.

Decoder

The decoder 102 decodes the current switching data N, and outputs the one-bit decoded signal G1 that controls the switching of analog switches S1a and S1b, the one-bit decoded signal G2 that controls the switching of analog switches S2a and S2b, the one-bit decoded signal G3 that controls the switching of analog switches S3a and S3b, and the one-bit decoded signal G4 that controls the switching of analog switches S4a and S4b.

When the current switching data N is −2 (110), the decoder 102 outputs G1 and G2 as '1' and G3 and G4 as '0' in order to turn on analog switches S1a, S1b, S2a, and S2b and turn off analog switches S3a, S3b, S4a, and S4b;

when N is −1 (111), the decoder 102 outputs G1 as '1' and G2, G3, and G4 as '0' in order to turn on analog switches S1a and S1b and turn off analog switches S2a, S2b, S3a, S3b, S4a, and S4b;

when N is 0 (000), the decoder 102 outputs G1, G2, G3, and G4 as '0' in order to turn off all the analog switches;

when N is +1 (001), the decoder 102 outputs G1, G2, and G4 as '0' and G3 as '1' in order to turn on analog switches S3a and S3b and turn off analog switches S1a, S1b, S2a, S2b, S4a, and S4b;

when N is +2 (010), the decoder 102 outputs G1, G2, G3, and G4, as '0' in order to turn on analog switches S3a, S3b, S4a, and S4b and turn off analog switches S1a, S1b, S2a, and S2b.

Accordingly, the four pairs of analog switches S1a, S1b, S2a, S2b, S3a, S3b, S4a, and S4b all operate differently:

analog switches S1a and S1b are turned on when the current switching data N is −1 or −2 and the current switching signal S is '1', and are turned off when N is 0, +1, or +2, or S is '0';

analog switches S2a and S2b are turned on when N is −2 and S is '1', and are turned off when N is −1, 0, +1, or +2, or S is '0';

analog switches S3a and S3b are turned on when N is +1 or +2, and are turned off when N is 0, −1, or −2;

analog switches S4a and S4b are turned on when N is +2, and are turned off when N is −2, −1, 0, or +1.

Figure 16:
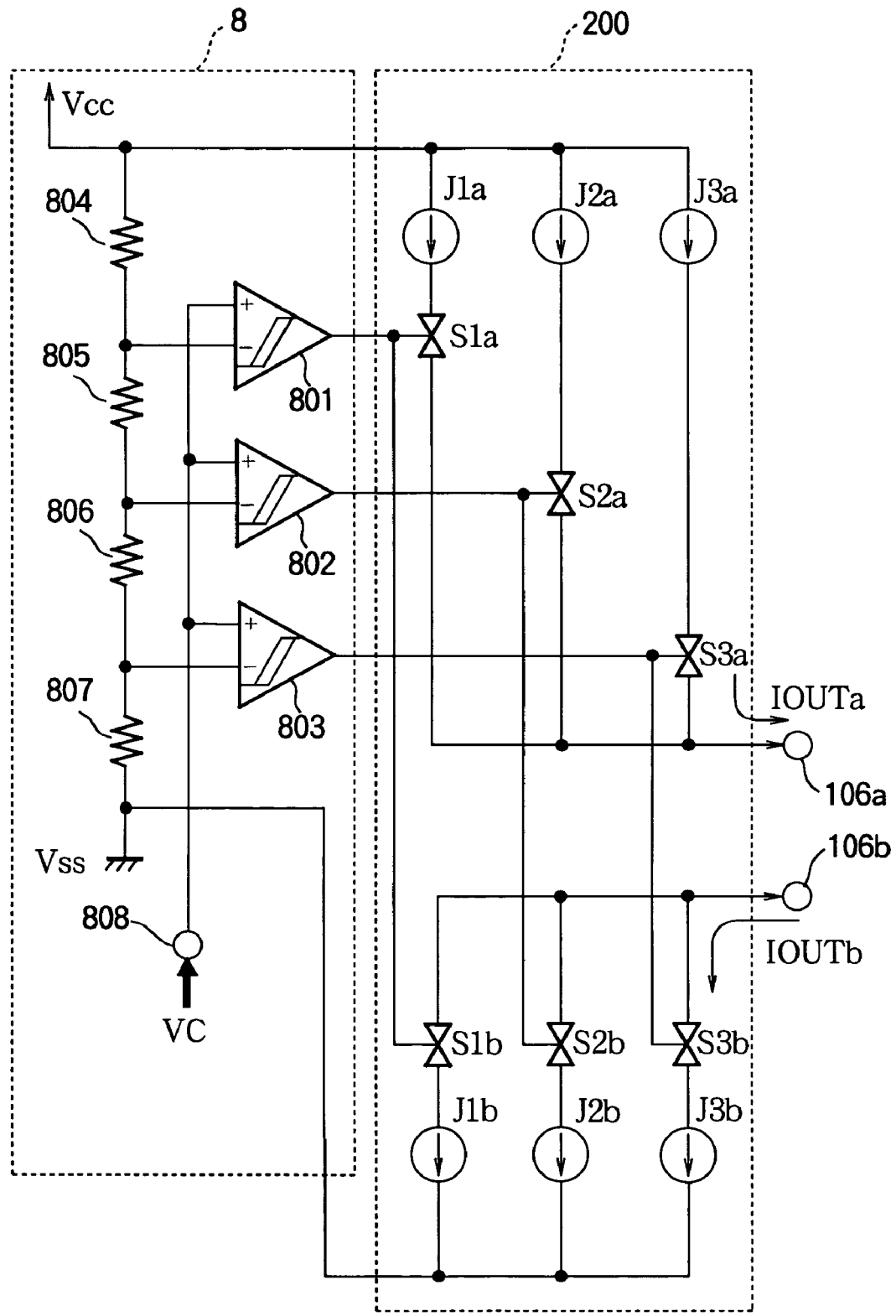
FIG. 16 is a circuit diagram of the analog-to-digital converter and current source circuit in the conventional local oscillator circuit.
Figure 17A:
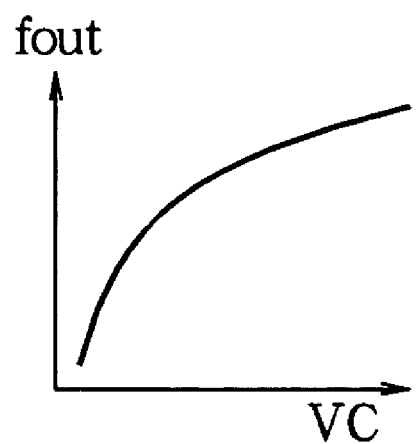
FIG. 17A and FIG. 17B illustrate operating characteristic of the conventional local oscillator circuit.
Figure 17B:
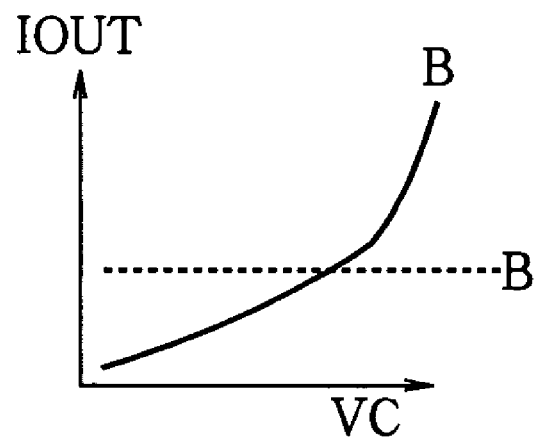

As described above, the local oscillator circuit in the first embodiment does not switch the magnitude of the current IOUT output from the charge pump 10 responsive to the current switching data N output by the logic circuit 11 instead of the control voltage VC output from the loop filter 3, so the analog-to-digital converter 8 (FIGS. 14 and 16) found in the conventional local oscillator circuit is unnecessary. Furthermore, during the first part of the frequency locking operation, the switching of the magnitude of the current is partly disabled by the current switching signal S.

The reason for controlling the current in this way and the situations in which this type of control is useful will be described below. In the conventional local oscillator circuit (FIG. 16), the current IOUT output from the charge pump is varied so that the product K×IOUT of the frequency sensitivity K and current IOUT has a substantially constant value over the entire range of the output frequency fout, in which the control voltage VC in the voltage-controlled oscillator 4 varies from 0 V to the power supply voltage (Vcc). If P indicates this constant value, the product K×IOUT does not vary greatly with the output frequency fout, but is kept substantially equal to the constant value P. This function is necessary if there is not much lock time margin, or if the lock time must not vary with the frequency setting f but must be the same for all settings.

In some devices such as communication devices including a local oscillator circuit, however, although the frequency must be locked accurately, there may be an ample lock time margin. In a device of this type, the output frequency fout can converge within the necessary time even if the current IOUT output from the charge pump has a fixed value. This fixed value may be, for example, a value that makes K×IOUT equal to the constant value P at an assumed specific frequency sensitivity K.

The accuracy of the output frequency fout can be ensured regardless of the frequency setting f by switching the current IOUT output from the charge pump from the above fixed value to another fixed value, making the product K×IOUT substantially equal to the constant value P, after the completion of the frequency locking operation, or at a time when the frequency locking operation has proceeded to some extent and the output frequency fout is close to the frequency setting f.

The frequency sensitivity K of the voltage-controlled oscillator 4 corresponding to the frequency setting f is uniquely determined when the frequency setting f is made, if variability in the circuit elements is ignored. Since the value of the frequency setting f is stored in the logic circuit 11 as digital data, and the frequency division ratio n generated according to the frequency setting f is stored in the programmable counter 6, the frequency accuracy of the local oscillator circuit can be ensured by switching the current IOUT output from the charge pump 10 according to either the frequency setting f or the frequency division ratio n, when the frequency locking operation is completed or has proceeded to some extent.

If the frequency setting f is in the frequency region f0–f2 in FIG. 4, for example, then during the first frequency lock time T1 in FIG. 5, the frequency locking operation is performed with the current IOUT output from the charge pump 10 set to a value such that the product K3×IOUT can be regarded as being equal to P, where K3 is the frequency sensitivity when the output frequency fout is in the frequency region f2–f3. If the frequency setting f is in the frequency region f0–f1, then at timings t1 and t5, when the frequency locking operation proceeds from the first frequency lock time T1 to the second frequency lock time T2, or at timings t2 and t6, when the frequency locking operation is completed, the current IOUT output from the charge pump 10 is switched to a value such that the product K1×IOUT can be regarded as being equal to P, where K1 is the frequency sensitivity when the output frequency fout is in the frequency region f0–f1. If the frequency setting f is in the frequency region f1–f2, then at timings t1 and t5, or at timings t2 and t6, the current IOUT is switched to a value such that the product K2×IOUT can be regarded as being equal to P, where K2 is the frequency sensitivity when the output frequency fout is in the frequency region f1–f2.

If the frequency setting f is in the frequency region f2–f3 in FIG. 4, then during the first frequency lock time T1 in FIG. 5 the frequency locking operation is performed with the current IOUT output from the charge pump 10 set to the same value as above, such that the product K3×IOUT can be regarded as being equal to P, K3 being the frequency sensitivity when the output frequency fout is in the frequency region f2–f3, and the current IOUT is not switched at timings t1 and t5, or at timings t2 and t6. If the frequency setting f is in the frequency region f3–f4, then during the first frequency lock time T1 the frequency locking operation is performed with the current IOUT set to a value such that the product K4×IOUT can be regarded as being equal to the P, where K4 is the frequency sensitivity when the output frequency fout is in the frequency region f3–f4, and the current IOUT is not switched at timings t1 and t5, or at timings t2 and t6. Similarly, if the frequency setting f is in the frequency region f4–f5, then during the first frequency lock time T1 the frequency locking operation is performed with the current IOUT set to a value such that the product K5×IOUT can be regarded as being equal to P, where K5 is the frequency sensitivity when the output frequency fout is in the frequency region f4–f5, and the current IOUT is not switched at timings t1 and t5, or at timings t2 and t6.

Figure 7A:
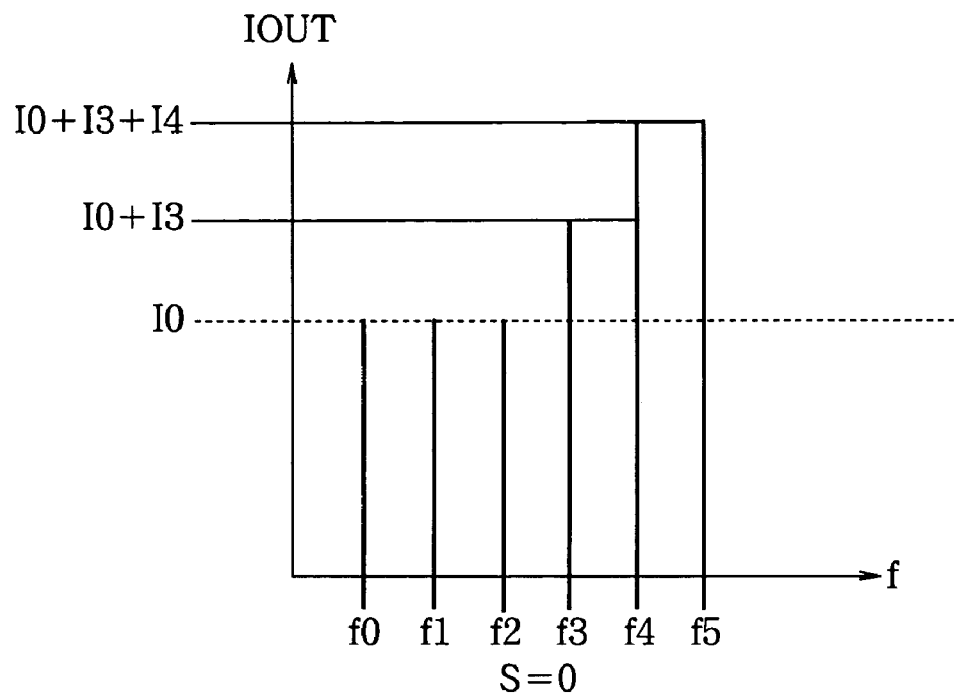
FIGS. 7A and 7B illustrate output current v. frequency setting characteristics in the charge pump in the first embodiment.
Figure 7B:
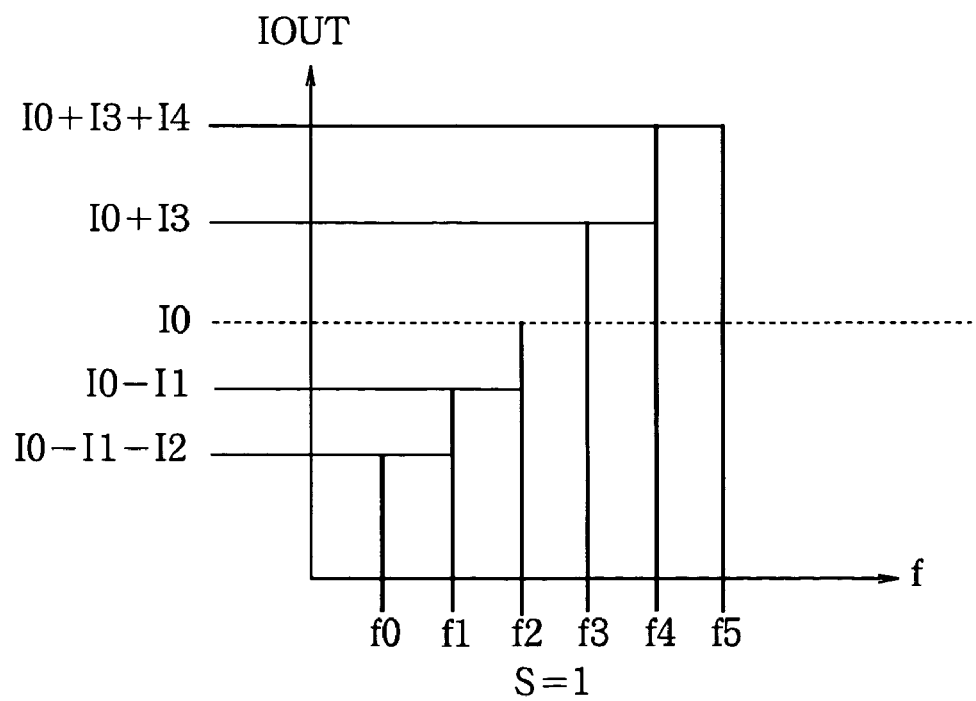

The operating characteristics of the charge pump 10 are illustrated in FIGS. 7A and 7B: FIG. 7A shows how the output current IOUT varies with the frequency setting f when the current switching signal S is '0'; FIG. 7B shows how the output current IOUT varies with the frequency setting f when S is '1'.

During the first frequency lock time in FIG. 5, since the current switching signal S is '0', although analog switches S3a and S3b are turned on when the frequency setting f is equal to or greater than f3, and analog switches S4a and S4b are also turned on when the frequency setting f is equal to or greater than f4, analog switches S1a, S1b, S2a, and S2b are not turned on even if the frequency setting f is less than f2.

Accordingly, the current IOUT output from the charge pump 10 (the current IOUTa fed to the loop filter 3, or the current IOUTb drawn from the loop filter 3) varies with the frequency setting f (the current switching data N), as shown in FIG. 7A, as follows.

| | | |
|---|---|---|
| f0 ≦ f < f3 (N = −2, −1, or 0) | IOUT = I0 = 200 μA |
| f3 ≦ f < f4 (N = +1) | IOUT = I0 + I3 = 270 μA |
| f4 ≦ f < f5 (N = +2) | IOUT = I0 + I3 + I4 = 400 μA |

As described above, when the frequency setting f is between f0 (inclusive) and f3, the current IOUT has a fixed value, and the product K×IOUT of the frequency sensitivity K and current IOUT output from the charge pump 10 varies with the output frequency fout as follows.

| | |
|---|---|
| f0 ≦ fout < f1 | K1 × 200 = 32000 MHz · μA/V |
| f1 ≦ fout < f2 | K2 × 200 = 22000 MHz · μA/V |
| f2 ≦ fout < f3 | K3 × 200 = 16000 MHz · μA/V |
| f3 ≦ fout < f4 | K4 × 200 = 13000 MHz · μA/V |
| f4 ≦ fout < f5 | K5 × 200 = 8000 MHz · μA/V |

When the frequency setting f is between f3 (inclusive) and f4, the product K×IOUT varies with the output frequency fout as follows.

| | |
|---|---|
| f0 ≦ fout < f1 | K1 × 270 = 43200 MHz · μA/V |
| f1 ≦ fout < f2 | K2 × 270 = 29700 MHz · μA/V |
| f2 ≦ fout < f3 | K3 × 270 = 21600 MHz · μA/V |
| f3 ≦ fout < f4 | K4 × 270 = 17550 MHz · μA/V |
| f4 ≦ fout < f5 | K5 × 270 = 10800 MHz · μA/V |

When the frequency setting f is between f4 (inclusive) and f5, the product K×IOUT varies with the output frequency fout as follows.

| | |
|---|---|
| f0 ≦ fout < f1 | K1 × 400 = 64000 MHz · μA/V |
| f1 ≦ fout < f2 | K2 × 400 = 44000 MHz · μA/V |
| f2 ≦ fout < f3 | K3 × 400 = 32000 MHz · μA/V |
| f3 ≦ fout < f4 | K4 × 400 = 26000 MHz · μA/V |
| f4 ≦ fout < f5 | K5 × 400 = 16000 MHz · μA/V |

If the current switching signal S were to be set to '1' during the first frequency lock time T1, so that the current IOUT output from the charge pump 10 varied with the frequency setting f as shown in FIG. 7B, including the following variations,

| | |
|---|---|
| f0 ≦ f < f1 | IOUT = I0 − I1 − I2 = 100 μA |
| f1 ≦ f < f2 | IOUT = I0 − I2 = 160 μA | then for frequency settings f less than f2, when the output frequency fout was between f4 (inclusive) and f5, the product K×IOUT would be too low and the lock time would be too long. That is why the current switching signal S is set to '0' to disable the control of the switching of the current by the current switching data N when f0≦f<f2, leaving the current IOUT when f0≦f<f2 set to the same fixed value as when f2≦f<f3, thereby shortening the lock time when f4≦fout<f5.

During the first frequency lock time T1, for a frequency setting f between f4 (inclusive) and f5, when the output frequency fout is less than f2, the product K×IOUT is too high, but the frequency locking operation does not diverge, and in fact the lock time is shortened. The current is therefore switched according to the current switching data N, the high value of K×IOUT notwithstanding. If the frequency locking operation diverges, current switching control will be disabled.

During the second frequency lock time T2 in FIG. 5, since the current switching signal S is '1', analog switches S1a, S1b, S2a, and S2b are turned on when the frequency setting f is less than frequency f1 in FIG. 4, and analog switches S1a and S1b are turned on when the frequency setting f is between f1 (inclusive) and f2.

Accordingly, when the frequency setting f is between f2 (inclusive) and f3 and the current switching data N is zero, since current I0 is fed from current source J0a to terminal 106a, the current IOUTa fed to the loop filter 3 is equal to I0; since the same current I0 is drawn from terminal 106b by current source J0b, the current IOUTb drawn from the loop filter 3 is equal to I0. The current IOUT output from the charge pump (current IOUTa or current IOUTb) therefore has the following magnitude, as shown in FIG. 7B.

IOUT=I0=200 μA

When f1≦f<f2 (N=−1), since current I0 is fed from current source J0a to terminal 106a and current I1 is drawn from terminal 106a by current source J1a, IOUTa=I0−I1; since current I0 is drawn from terminal 106b by current source J0b and current I1 is fed from current source J1b to terminal 106b, IOUTb=I0−I1. The current IOUT output from the charge pump (current IOUTa or current IOUTb) therefore has the following magnitude, as shown in FIG. 7B:

IOUT=I0−I1=160 μA

Similarly, when f0≦f<f1 (N=−2), since current I0 is fed from current source J0a to terminal 106a and currents I1 and I2 are drawn from terminal 106a by current sources J1a and J2a, IOUTa=I0−I1−I2; since current I0 is drawn from terminal 106b by current source J0b and currents I1 and I2 are fed from current source J1b and J2b to terminal 106b, IOUTb=I0−I1−I2. The current IOUT output from the charge pump (current IOUTa or current IOUTb) therefore has the following magnitude, as shown in FIG. 7B:

IOUT=I0−I1−I2=100 μA

When f3≦f<f4 (N=+1), since currents I0 and I3 are fed from current sources J0a and J3a to terminal 106a, IOUTa=I0+I3; since currents I0 and I3 are drawn from terminal 106b by current source J0b and J3b, IOUTb=I0+I3. The current IOUT output from the charge pump (current IOUTa or current IOUTb) therefore has the following magnitude, as shown in FIG. 7B:

IOUT=I0+I3=270 μA

Similarly, when f4≦f<f5 (N=+2), since currents I0, I3, and I4 are fed from current sources J0a, J3a, and J4a to terminal 106a, IOUTa=I0+I3+I4; since currents I0, I3, and I4 are drawn from terminal 106b by current source J0b, J3b, and J4b, IOUTb=I0+I3+I4. The current IOUT output from the charge pump (current IOUTa or current IOUTb) therefore has the following magnitude, as shown in FIG. 7B:

IOUT=I0+I3+I4=400 μA

The product K×IOUT of the frequency sensitivity K and current IOUT output from the charge pump 10 varies with the frequency setting f and the output frequency fout as follows.

| | | |
|---|---|---|
| f0 ≦ f < f1 | f0 ≦ fout < f1 | K1 × 100 = 16000 MHz · μA/V |
| f1 ≦ f < f2 | f1 ≦ fout < f2 | K2 × 160 = 17600 MHz · μA/V |
| f2 ≦ f < f3 | f2 ≦ fout < f3 | K3 × 200 = 16000 MHz · μA/V |
| f3 ≦ f < f4 | f3 ≦ fout < f4 | K4 × 270 = 17550 MHz · μA/V |
| f4 ≦ f < f5 | f4 ≦ fout < f5 | K5 × 400 = 16000 MHz · μA/V |

As described above, after the output frequency fout has been brought to the same one of the five divided frequency regions in FIG. 4 as the frequency setting f, an increase in the frequency sensitivity K is compensated for by decreasing the current IOUT in the voltage-controlled oscillator 4, and a decrease in the frequency sensitivity K is compensated for by increasing the current IOUT, so the product K×IOUT has a substantially constant value over the entire frequency range of frequency settings f between f0 (inclusive) and f5, and is appropriately sized to improve the accuracy of the output frequency after the frequency locking operation.

Immediately after the current switching signal S has switched from '0' to '1' and the frequency locking operation has proceeded from the first frequency lock time T1 to the second frequency lock time T2, since the frequency locking operation has not been completed, the output frequency fout may enter a frequency region in which the product K×IOUT has a value different from the product K×IOUT in the frequency region of the frequency setting f. The product K×IOUT will then be closer to the desired value than it would have been if the current output from the charge pump were not adjusted, however, so the different value of K×IOUT will not hinder the frequency locking operation.

Figure 8A:
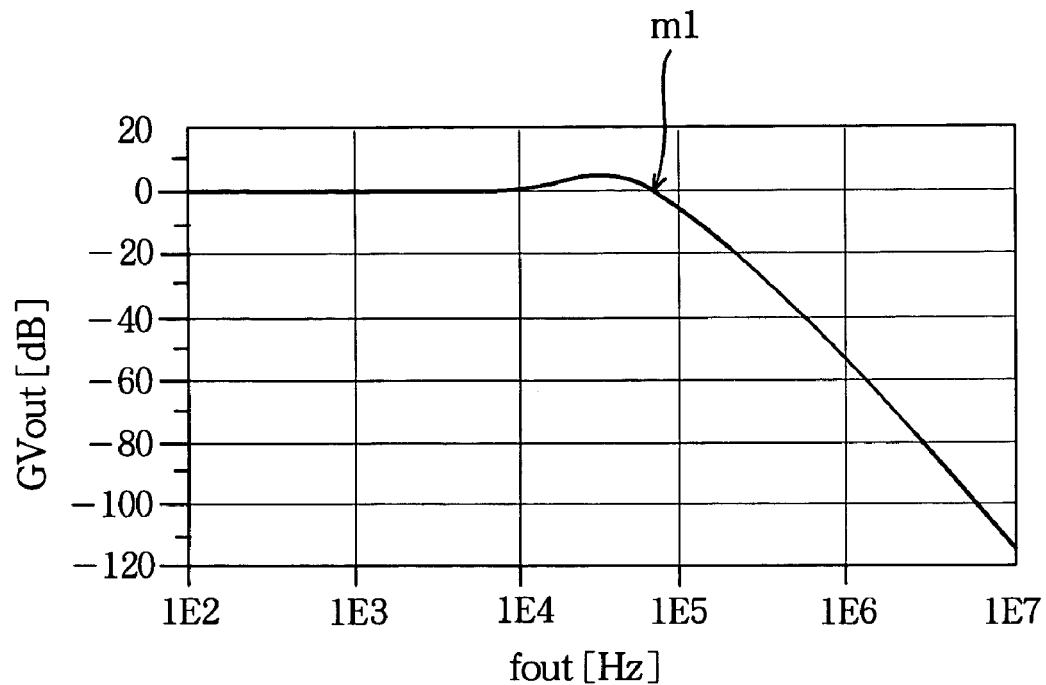
FIGS. 8A and 8B illustrate voltage gain v. oscillation frequency characteristics of a feedback loop in the first embodiment.
Figure 8B:
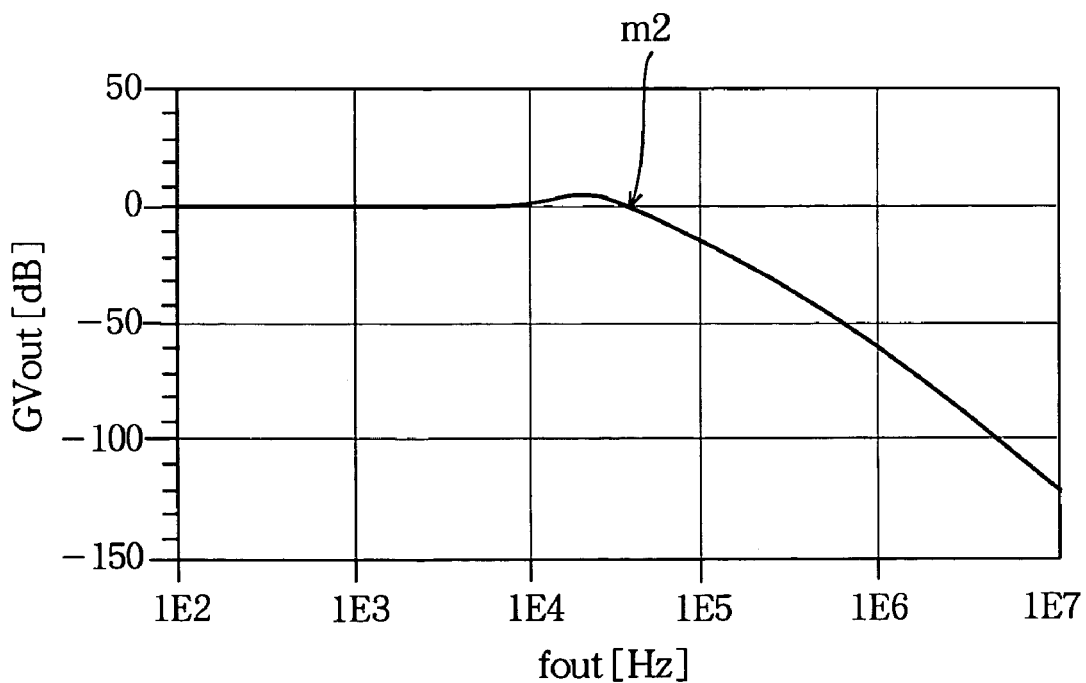

FIGS. 8A and 8B illustrate the voltage gain GVout of the feedback loop as a function of the oscillation frequency fout of the local oscillator circuit in the first embodiment during the second frequency lock time T2 in FIG. 5, when the frequency setting f is frequency f5 in FIG. 4. FIG. 8A illustrates the case in which current switching control is performed by turning on analog switches S3a, S3b, S4a, and S4b; FIG. 8B illustrates the case in which current switching control is not performed and analog switches S3a, S3b, S4a, and S4b are turned off.

At the point denoted m1 in FIG. 8A, the output frequency fout is equal to 64.57 kHz, and the voltage gain GVout is equal to −0.217 dB; at the point denoted m2 in FIG. 8B, the output frequency fout is equal to 37.15 kHz and the voltage gain GVout is equal to −0.228 dB.

The bandwidth of the feedback loop is accordingly reduced to 37 kHz when current switching control is not performed, as in FIG. 8B, but is restored to 64 kHz when current switching control is performed, as in FIG. 8A. The larger bandwidth reduces changes in the output frequency after the frequency locking operation is completed and improves the accuracy of the output frequency.

As described above, according to the first embodiment, control of the switching of the current IOUT output from the charge pump 10 corresponding to the frequency setting f eliminates the need to include the analog-to-digital converter found in the conventional local oscillator circuit, so all the comparators in the conventional local oscillator circuit can be omitted, thereby saving space and reducing power consumption during operation.

Due to the use of the current switching signal S, even if the output frequency fout falls into a frequency band in which the frequency sensitivity K is too low during the first frequency lock time T1, the output frequency fout is restored to a frequency near the frequency setting f within an allowable time.

The conventional local oscillator circuit requires a resistance ladder to output reference voltages for switching the current in the charge pump, so the switching is affected by fabrication variability in the resistance elements. The first embodiment switches the current in the charge pump 10 according to the digital data N indicating the frequency setting f, so the switching of the current is unaffected by fabrication variability in resistance elements.

Second Embodiment

In the first embodiment, the magnitude of the current IOUT output from the charge pump 10 is switchable among five arbitrary values (I0−I1−I2, I0−I1, I0, I0+I3, I0+I3+I4). The general method of generating currents with arbitrary magnitudes in a charge pump in a local oscillator is to use separate current source blocks to generate currents flowing in the pump-up and pump-down directions. In the first embodiment, the current source block 100a that generates the current OUTA that pumps up the control voltage VC is separate from the current source block 100b generates the current OUTB that pumps down the control voltage VC. Implementation of the charge pump 10 in the first embodiment, however, requires ten current sources.

If the frequency sensitivity K varies slowly, or the necessary range of frequency settings f is narrower than the entire frequency range of the voltage-controlled oscillator, however, the current output from the charge pump can be set to values that are symmetric with respect to the current I0, such as I0−I1−I2, I0−I1, I0, I0+I1, and I0+I1+I2. The total number of current sources in the charge pump can then be reduced from the ten in the current source circuit 100 in the first embodiment to six as in the current source circuit in the second embodiment described below. More generally, although a number of current sources equal to twice the number of current switching levels is necessary in the current source circuit in the first embodiment, the number of current sources can be reduced to the number of current switching levels plus one in the second embodiment.

FIG. 9 shows a circuit diagram of the current source circuit in the charge pump in a local oscillator circuit according to the second embodiment. The local oscillator circuit in the second embodiment differs from the local oscillator circuit (in FIG. 1) in the first embodiment by including a current source circuit 120 differing from the current source circuit 100 (in FIG. 6) in the charge pump 10 (in FIG. 2).

As shown in FIG. 9, the current source circuit 120 in the second embodiment includes current sources J0a, J0b, J1, J2, J3, J4, analog switches S1a, S1b, S2a, S2b, S3a, S3b, S4a, S4b, AND gates 103, 104, 121, 122, a decoder 102, an input terminal 105 receiving the current switching signal S, a terminal 106a for feeding current IOUTa, and a terminal 106b for drawing current IOUTb.

Current source J0a is connected between the power supply (Vcc) and terminal 106a; current source J0b is connected between terminal 106b and ground (Vss). The terminals of the current sources J3 and J4 sourcing currents I1 and I2 are connected to the power supply (Vcc); the terminals of the current sources J1 and J2 sinking currents I1 and I2 are connected to ground (Vss). Current sources J0a, J3, and J4 include p-channel FETs; current sources J0b, J1, and J2 include n-channel FETs.

Analog switch S1a is connected between terminal 106a and the terminal of current source J1 that sinks current I1; analog switch S2a is connected between terminal 106a and the terminal of current source J2 that sinks current I2; analog switch S3a is connected between terminal 106a and the terminal of current source J3 that sources current I1; analog switch S4a is connected between terminal 106a and the terminal of current source J4 that sources current I2. Analog switch S1b is connected between terminal 106b and the terminal of current source J3 that sources current I1; analog switch S2b is connected between terminal 106b and the terminal of current source J4 that sources current I2; analog switch S3b is connected between terminal 106b and the terminal of current source J1 that sinks current I1; analog switch S4b is connected between terminal 106b and the terminal of current source J2 that sinks current I2. The four current sources J1, J2, J3, and J4 are accordingly connected to both terminals 106a and 106b through analog switches S1a and S3b, S2a and S4b, S3a and S1b, and S4a and S2b, respectively.

AND gate 103 receives the current switching signal S and a decoded signal G1 from the decoder 102; the signal output from AND gate 103 is input to the control terminals of analog switches S1a and S1b. AND gate 104 receives the current switching signal S and a decoded signal G2 from the decoder 102; the signal output from AND gate 104 is input to the control terminals of analog switches S2a and S2b. AND gate 121 receives the current switching signal S and a decoded signal G3 from the decoder 102; the signal output from AND gate 121 is input to the control terminals of analog switches S3a and S3b. AND gate 122 receives the current switching signal S and a decoded signal G4 from the decoder 102; the signal output from AND gate 122 is input to the control terminals of analog switches S4a and S4b.

The voltage pump-up current source block that feeds current IOUTa to the loop filter 3 (in FIG. 1) to raise the control voltage VC in the voltage-controlled oscillator 4 (in FIG. 1 and FIG. 3) comprises current sources J0a, J1, J2, J3, J4, analog switches S1a, S2a, S3a, S4a, AND gates 103, 104, 121, 122 and decoder 102; the voltage pump-down current source block that draws current IOUTb from the loop filter 3 to lower the control voltage VC comprises current sources J0b, J1, J2, J3, J4, analog switches S1b, S2b, S3b, S4b, AND gates 103, 104, 121, 122, and decoder 102. Current sources J1, J2, J3, and J4 are shared by the voltage pump-up and pump-down current source blocks.

The decoded signals G1, G2, G3, G4 from the decoder 102 and the current switching signal S control the switching of analog switches S1a, S1b, S2a, S2b, S3a, S3b, S4a, S4b so that the current IOUTa fed to the loop filter 3 when analog switch SU in the output circuit 101 (in FIG. 2) is in the conducting state and the current IOUTb drawn from the loop filter 3 when analog switch SD in the output circuit 101 is in the conducting state have the same value.

The current I0 supplied by current sources J0a and J0b is set to the median value of the current output from the charge pump, and is equal to, for example, 200 µA. Although current sources J1 and J3 supply the same current I1 and current sources J2 and J4 supply the same current I2, there is no need for the currents I1 and I2 to have the same value. For example, I1 may be equal to 40 µA and I2 may be equal to 60 µA.

The four pairs of analog switches S1a, S1b, S2a, S2b, S3a, S3b, S4a, S4b operate according to the decoded signals G1, G2, G3, G4 from the decoder 102 and the current switching signal S as follows:

analog switches S1a and S1b are turned on when the current switching data N is −1 or −2 and the current switching signal S is '1', and are turned off when N is 0, +1, or +2, or S is '0';

analog switches S2a and S2b are turned on when N is −2 and S is '1', and are turned off when N is −1, 0, +1, or +2, or S is '0';

analog switches S3a and S3b are turned on when N is +1 or +2 and S is '1', and are turned off when N is −2, −1, or 0, or S is '0';

analog switches S4a and S4b are turned on when N is +2 and S is '1', and are turned off when N is −2, −1, 0, or +1, or S is '0'.

Figure 10:
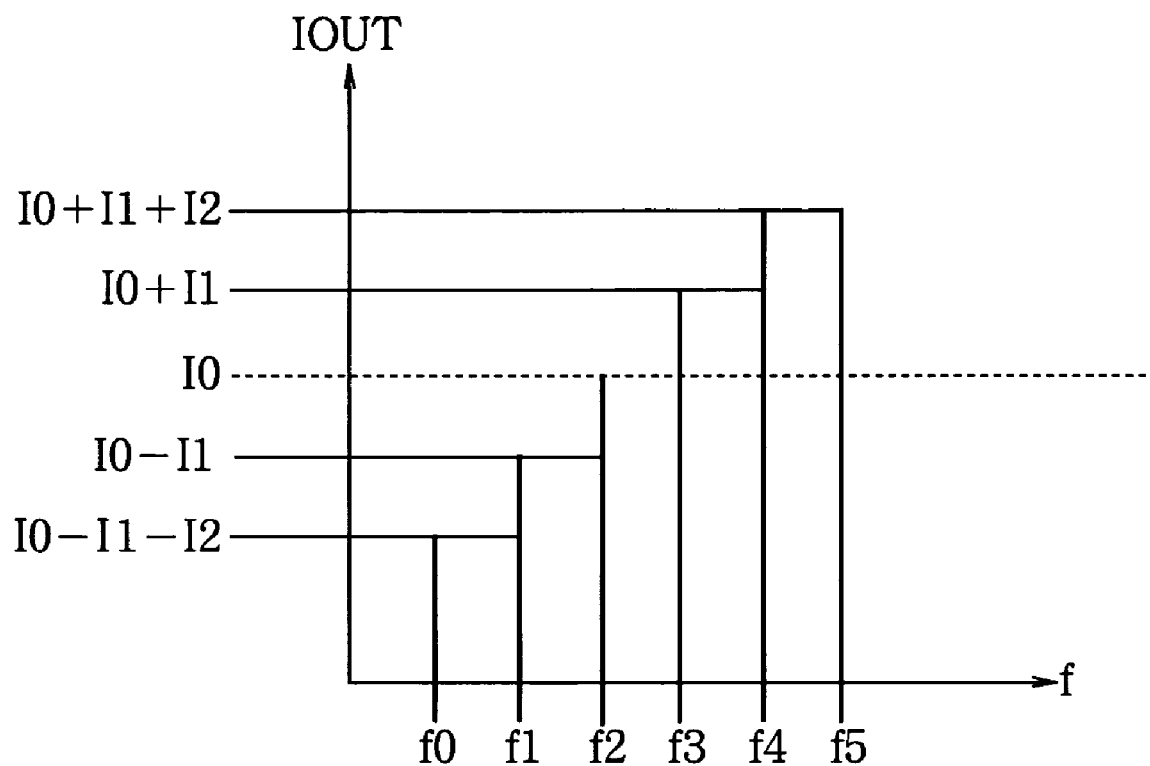
FIG. 10 illustrates an output current v. frequency setting characteristic in the second embodiment.

The operating characteristic of the charge pump in the second embodiment is illustrated in FIG. 10: FIG. 10 shows how the output current IOUT varies with the frequency setting f when the current switching signal S is '1' (thus when current switching control is enabled).

In the charge pump in the second embodiment, when the current switching signal S is '0' (disabling current switching control), the current IOUT output from the charge pump (current IOUTa or current IOUTb) does not vary with the frequency setting f, but has the constant value I0 of 200 µA over the entire bandwidth of the output frequency fout. Accordingly, during the first frequency lock time T1 in FIG. 5, the current IOUT does not vary with the frequency setting f (IOUT=I0=200 µA).

During the second frequency lock time T2 in FIG. 5, since the current switching signal S is '1', analog switches S1a, S1b, S2a, and S2b are turned on if the frequency setting f is less than frequency f1 in FIG. 4; analog switches S1a and S1b are turned on if the frequency setting f is between f1 (inclusive) and f2; analog switches S3a and S3b are turned on if the frequency setting f is between f3 (inclusive) and f4; analog switches S3a, S3b, S4a, and S4b are turned on if the frequency setting f is between f4 (inclusive) and f5.

Accordingly, when the frequency setting f is between f2 (inclusive) and f3 and the current switching data N is zero, since current I0 is fed from current source J0a to terminal 106a, the current IOUTa fed to the loop filter 3 is equal to I0; since the same current I0 is drawn from terminal 106b by current source J0b, the current IOUTb drawn from the loop filter 3 is equal to I0. The current IOUT output from the charge pump (current IOUTa or current IOUTb) therefore has the following magnitude, as shown in FIG. 10.

IOUT=I0=200 µA

When f1≦f<f2 (N=−1), since current I0 is fed from current source J0a to terminal 106a and current I1 is drawn from terminal 106a by current source J1, IOUTa=I0−I1; since current I0 is drawn from terminal 106b by current source J0b and current I1 is fed from current source J3 to terminal 106b, IOUTb=I0−I1. The current IOUT output from the charge pump (current IOUTa or current IOUTb) therefore has the following magnitude, as shown in FIG. 10:

IOUT=I0−I1=160 µA

Compared with N=0, the current IOUT decreases by I1 when N=−1, compensating for the increase in the frequency sensitivity K in the voltage-controlled oscillator 4.

Similarly, when f0≦f<f1 (N=−2), since current I0 is fed from current source J0a to terminal 106a and currents I1 and I2 are drawn from terminal 106a by current sources J1 and J2, IOUTa=I0−I1−I2; since current I0 is drawn from terminal 106b by current source J0b and currents I1 and I2 are fed from current sources J3 and J4 to terminal 106b, IOUTb=I0−I1−I2. The current IOUT output from the charge pump (current IOUTa or current IOUTb) therefore has the following magnitude, as shown in FIG. 10:

IOUT=I0−I1−I2=100 µA

Compared with N=0, the current IOUT decreases by I1+I2 when N=−2, compensating for the increase in the frequency sensitivity K in the voltage-controlled oscillator 4.

When f3≦f<f4 (N=+1), since currents I0 and I1 are fed from current sources J0a and J3 to terminal 106a, IOUTa=I0+I1; since currents I0 and I1 are drawn from terminal 106b by current source J0b and J1, IOUTb=I0+I1.

The current IOUT output from the charge pump (current IOUTa or current IOUTb) therefore has the following magnitude, as shown in FIG. 10:

$$IOUT=I0+I1=240 \mu A$$

Compared with N=0, the current IOUT increases by I1 when N=+1, compensating for the decrease in the frequency sensitivity K in the voltage-controlled oscillator 4.

Similarly, when f4≦f<f5 (N=+2), since currents I0, I1, and I2 are fed from current sources J0a, J3, and J4 to terminal 106a, IOUTa=I0+I1+I2; since currents I0, I1, and I2 are drawn from terminal 106b by current source J0b, J1, and J2, IOUTb=I0+I1+I2. The current IOUT output from the charge pump (current IOUTa or current IOUTb) therefore has the following magnitude, as shown in FIG. 10:

$$IOUT=I0+I1+I2=300 \mu A$$

Compared with N=0, the current IOUT increases by I1+I2 when N=+2, compensating for the decrease in the frequency sensitivity K in the voltage-controlled oscillator 4.

As described above, the second embodiment shares current sources between the pair of current source blocks constituting the current source circuit in the charge pump, so the number of current sources in the current source circuit can be reduced to the number of current switching levels plus one.

Although the number of levels of current compensation is five in the description above, the number of levels in the second embodiment is not restricted five; there may be fewer or more than five levels. As the number of levels increases, the circuit structure in the second embodiment becomes increasingly effective in reducing the number of current sources, as compared with the first embodiment.

Third Embodiment

The local oscillator circuit according to the third embodiment of the invention described below differs from the local oscillator circuit in the first or second embodiment described above by including circuitry that compensates for unit-to-unit fabrication variability in frequency sensitivity.

Figure 11:
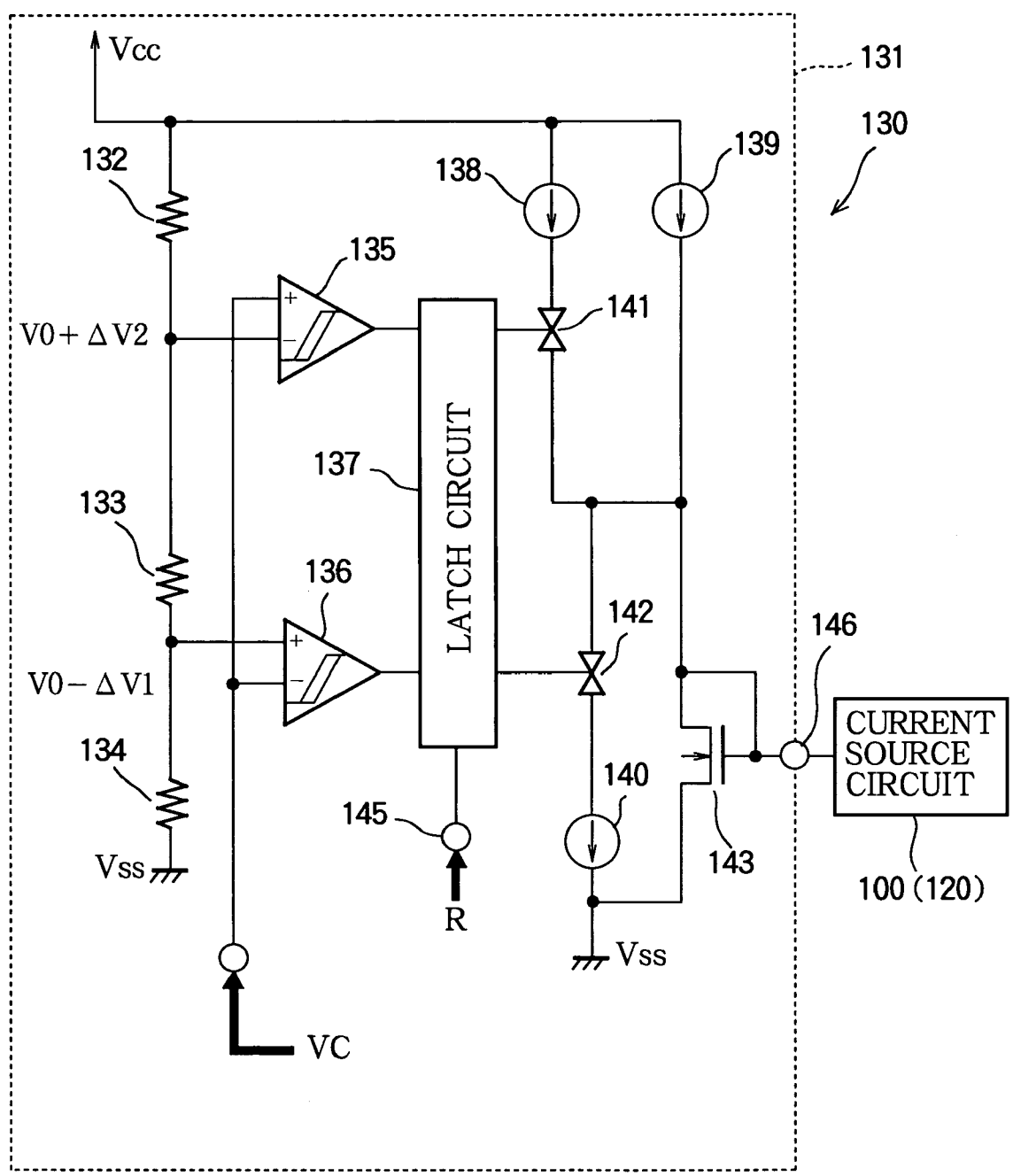
FIG. 11 is a circuit diagram of a current source in the charge pump in a third embodiment.

FIG. 11 shows the circuit configuration of the current source circuit 130 in the charge pump in the local oscillator circuit in the third embodiment. The current source circuit 130 in the third embodiment includes a reference current compensation circuit 131 in addition to the current source circuit 100 in the first embodiment or the current source circuit 120 in the second embodiment.

As shown in FIG. 11, the reference current compensation circuit 131 comprises resistors 132, 133, 134 for obtaining reference voltages V0−ΔV1 and V0+ΔV2, a pair of comparators 135, 136, a latch circuit 137, current sources 138, 139, 140, a pair of analog switches 141, 142, a rectifier-connected n-channel MOS FET 143, an input terminal 144 receiving the control voltage VC, an input terminal 145 receiving a latch timing signal R, and an output terminal 146 for output of a compensated signal.

The series circuit comprising the resistors 132, 133, 134 is connected between the power supply (Vcc) and ground (Vss); reference voltage V0−ΔV1 is generated at the node at which resistors 133 and 134 are interconnected; reference voltage V0+ΔV2 is generated at the node at which resistors 132 and 133 are interconnected.

The non-inverting input terminal of comparator 135 and the inverting input terminal of comparator 136 receive the control voltage VC of the voltage-controlled oscillator 4; the inverting input terminal of comparator 135 receives reference voltage V0+ΔV2; the non-inverting input terminal of comparator 136 receives reference voltage V0−ΔV1. The signals output from the comparators 135 and 136 are input to the latch circuit 137. The latch circuit 137 latches the signals output from the comparators 135 and 136 when the latch timing signal R changes from '0' to '1', outputs the latched signal received from comparator 135 to the control terminal of analog switch 141, and outputs the latched signal received from comparator 136 to the control terminal of analog switch 142. The latch timing signal R may be generated in the logic circuit 11 (in FIG. 1), for example.

Current source 139 and the series circuit comprising current source 138 and analog switch 141 are connected in parallel between the power supply (Vcc) and the output terminal 146; the series circuit comprising analog switch 142 and current source 140 is connected between the output terminal 146 and ground (Vss).

The gate electrode and the drain electrode of n-channel MOS transistor 143 are connected to the output terminal 146, and the source electrode of n-channel MOS transistor 143 is connected to ground (Vss). The output terminal 146 is connected to the gate electrodes of current source transistors (not shown) in the current sources J0a, J0b, J3a, J1b, J2a, J2b, J3a, J3b, J4a, J4b (FIG. 6) in the current source circuit 100 in the first embodiment, or to the gate electrodes of current source transistors (not shown) in the current sources J0a, J0b, J1, J2, J3, J4 (FIG. 9) in the current source circuit 120 in the second embodiment. N-channel MOS transistor 143 and any one of these current source transistors constitute a current mirror circuit; n-channel MOS transistor 143 generates a reference current for each of the current source transistors.

For example, the current supplied by current source 139 may be 20 μA, and the current supplied by current sources 138 and 140 may be approximately 1 μA.

In the reference current compensation circuit 131 having the structure described above, if the control voltage VC is in the range V0−ΔV1≦VC<V0+ΔV2 when the latch circuit 137 latches the signals output from the comparators 135 and 136, analog switches 141 and 142 are placed in the non-conducting state, and the current flowing through n-channel MOS transistor 143 is equal to 20 μA. In each of the current source transistors in the current source circuit in the first or second embodiment, a current proportional to the current that flows through n-channel MOS transistor 143 is generated according to a proportionality constant corresponding to the gate width of the current source transistor.

If VC≦V0−ΔV1 when the latch circuit 137 latches the signals output from the comparators 135 and 136, analog switch 141 is placed in the non-conducting state and analog switch 142 is placed in the conducting state, so the current flowing through n-channel MOS transistor 143 decreases from 20 μA to 19 μA. The current flowing through each of the current source transistors in the current source circuit 100 or 120 then decreases to nineteen twentieths (19/20) of the current that flows when V0−ΔV1<VC<V0+ΔV2.

If V0+ΔV2≦VC when the latch circuit 137 latches the signals output from the comparators 135 and 136, analog switch 141 is placed in the conducting state and analog switch 142 is placed in the non-conducting state, so the current flowing through n-channel MOS transistor 143 increases from 20 μA to 21 μA. The current flowing through each of the current source transistors in the current source circuit 100 or 120 then increases to twenty-one twentieths (21/20) of the current that flows when V0−ΔV1≦VC≦V0+ΔV2.

Figure 12:
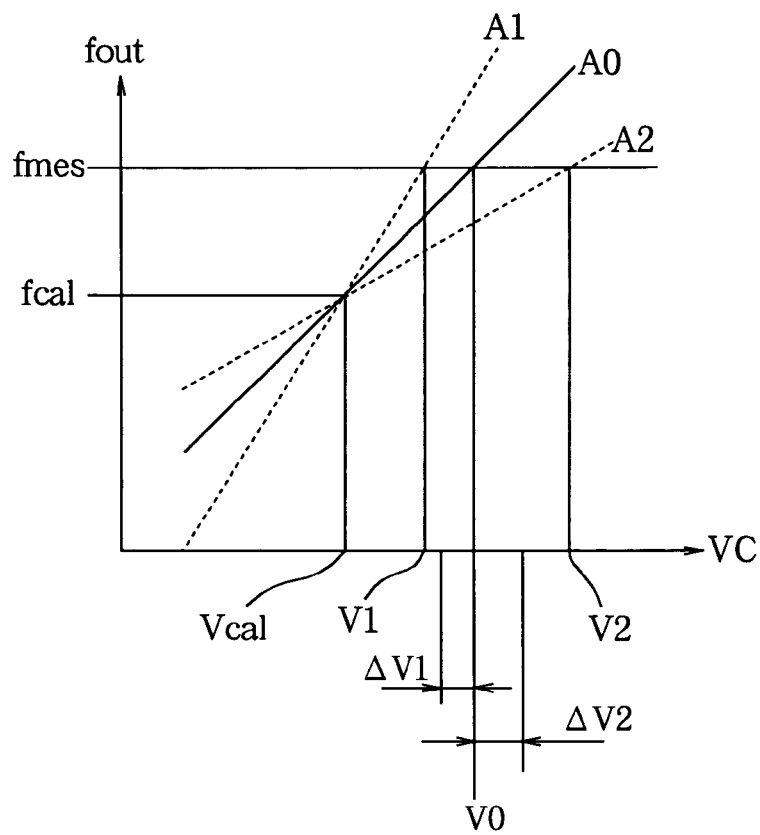
FIG. 12 is an enlarged view of part of the oscillation frequency v. control voltage characteristic in the voltage-controlled oscillator.

FIG. 12 is an enlarged diagram illustrating the operating characteristic of the voltage-controlled oscillator 4 (in FIGS. 1 and 3), showing how the output frequency fout varies with the control voltage VC. The oscillation characteristic (tuning curve) of the voltage-controlled oscillator 4 is automatically or manually calibrated so that, regardless of variability in circuit element characteristics, a given control voltage (VC=Vca1) generates a given calibration output frequency (fout=fca1). The calibration range is, for example, ±10 mV from the median value of the control voltage VC=VCca1.

Even after calibration, however, if unit-to-unit fabrication variability in the frequency sensitivity K is present, then the operating characteristic that relates the output frequency fout to the control voltage VC may vary. If line A0 in FIG. 12 indicates the median characteristic in the range of fabrication variability in the frequency sensitivity K, then dotted line A1 shows a case in which the frequency sensitivity K is higher than median, and dotted line A2 shows a case in which the frequency sensitivity K is lower than median.

For the current source circuits 100 and 120 in the first and second embodiments to operate effectively, on the premise that the frequency sensitivity K varies predictably according to the output frequency fout, if unit-to-unit variability is present in the frequency sensitivity K, the current IOUT output from the charge pump should be adjusted according to the frequency sensitivity K.

After calibration of the oscillation characteristic (tuning curve) of the voltage-controlled oscillator 4, the local oscillator circuit is oscillated in a stable manner at an output frequency fout=fmes for measurement of the frequency sensitivity K; the control voltage VC in the voltage-controlled oscillator 4 at that time is measured in the comparators 135 and 136 in the reference current compensation circuit 131; the signals output from the comparators 135 and 136 at the time of the measurement are latched in the latch circuit 137; the current IOUT output from the charge pump is adjusted. The output frequency fmes when the frequency sensitivity K is measured differs from the output frequency fca1 when the oscillation characteristic (tuning curve) is corrected; in FIG. 12, for example, fca1<fmes.

In FIG. 12, if V0 indicates the control voltage VC that generates the output frequency fmes when the frequency sensitivity K in the voltage-controlled oscillator 4 has the median value of fabrication variability illustrated by line A0, V1 indicates the control voltage VC that generates the output frequency fmes when the frequency sensitivity K is greater than the median value as illustrated by dotted line A1, and V2 indicates the control voltage VC that generates the output frequency fmes when the frequency sensitivity K is less than the median value as illustrated by dotted line A2, then V1<V0<V2.

Figure 13:
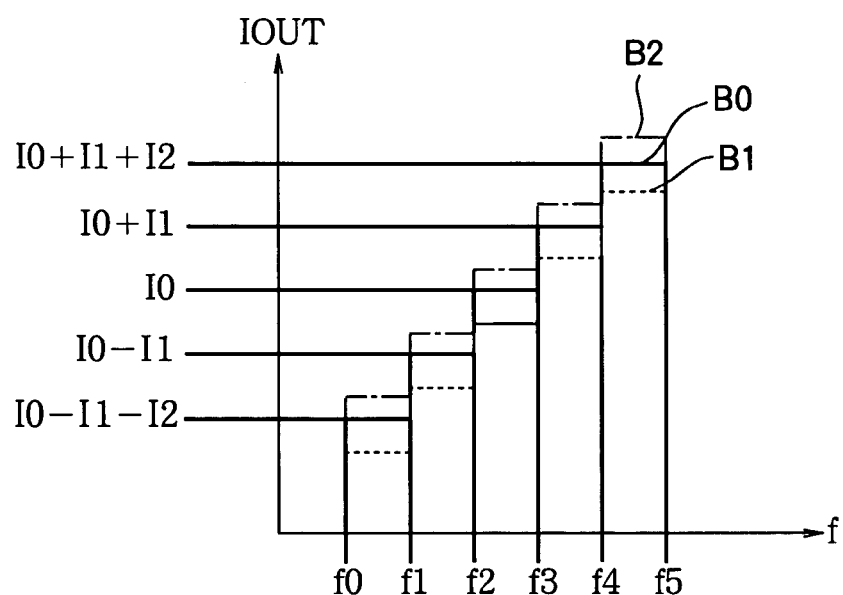
FIG. 13 illustrates an output current v. frequency setting characteristic in the third embodiment.

The operating characteristic of the charge pump in the third embodiment is illustrated in FIG. 13: FIG. 13 shows how the output current IOUT varies with the frequency setting f when the current source circuit 130 includes the reference current compensation circuit 131 and the current source circuit 120 of the second embodiment.

The frequency sensitivity K of a voltage-controlled oscillator is said to be within tolerance if the control voltage VC measured in the measurement of the frequency sensitivity K described above is within the range V0−ΔV1−VC≦V0+ΔV2. For example, line A0 in FIG. 12 indicates a frequency sensitivity K that is within tolerance. When the measurement result is latched in the latch circuit 137, analog switches 141 and 142 in the reference current compensation circuit 131 are turned off, and the current IOUT output from the charge pump in the maximum range has the magnitude B0 shown in FIG. 13.

If the control voltage VC at the time of the measurement of the frequency sensitivity K is below the tolerance range (VC≦V0−ΔV1), as illustrated by the dotted line A1 in FIG. 12, the frequency sensitivity K exceeds the tolerance. When the measurement result is latched in the latch circuit 137, analog switch 142 in the reference current compensation circuit 131 is turned on to decrease the current IOUT output from the charge pump to the level B1 in FIG. 13, thereby compensating for the increased frequency sensitivity K and bringing the product K×IOUT of the frequency sensitivity K and current IOUT near the median value of fabrication variability.

If the control voltage VC at the time of the measurement of the frequency sensitivity K is above the tolerance range (V0+ΔV2≦VC), as illustrated by the dotted line A2 in FIG. 12, the frequency sensitivity K is under the tolerance. When the measurement result is latched in the latch circuit 137, analog switch 141 in the reference current compensation circuit 131 is turned on to increase the current IOUT, thereby compensating for the reduced frequency sensitivity K and bringing the product K×IOUT near the median value of fabrication variability.

The frequency sensitivity K may be measured in the circuit or by software that controls the entire circuit system including the local oscillator circuit. One measurement is preferably made each time the local oscillator circuit is activated. After the measurement result has been latched in the latch circuit 137 in the reference current compensation circuit 131, since the comparators 135 and 136 in the reference current compensation circuit 131 are unnecessary, the comparators 135 and 136 can be deactivated during the operation of the local oscillator circuit, and the supply of current to the resistor ladder comprising resistors 132, 133, 134 may also be halted. The reference current compensation circuit 131 then consumes no more current than necessary to generate the reference current.

As described above, according to the third embodiment, even if the frequency sensitivity K of the voltage-controlled oscillator varies due to fabrication variability, the reference current compensation circuit 131 compensates for variability in the frequency sensitivity K by modifying the current IOUT output from the charge pump, thereby bringing the product K×IOUT of the frequency sensitivity K and current IOUT near the necessary value, so the accuracy of the output frequency fout can be ensured.

Although variability in the frequency sensitivity K is detected by two comparators in the third embodiment, the number of the comparators can be increased to improve the accuracy of the compensation, and to enlarge the range over which compensation is possible.

Those skilled in the art will recognize that further variations are possible within the scope of the invention, which is defined in the appended claims.

What is claimed is:

1. A local oscillator circuit having a selectable frequency setting, comprising:
   a control voltage generator receiving a first current having a magnitude and a direction, generating a control voltage, and raising and lowering the control voltage according to the first current;
   a voltage-controlled oscillator generating an output signal having a frequency responsive to said control voltage;
   a frequency divider dividing the frequency of the output signal of the voltage-controlled oscillator by a frequency division ratio selectable according to said frequency setting, thereby generating a divided signal;
a phase detector comparing phases of the divided signal and a reference frequency signal to generate a phase detection signal; and
a current generator generating the first current, switching the direction of the first current according to the phase detection signal, switching the magnitude of the first current according to the frequency setting, thereby bringing the frequency of the output signal of the voltage-controlled oscillator to said frequency setting;
wherein the current generator comprises:
a first terminal switchably coupled to the control voltage generator, feeding the first current to the control voltage generator when the first current flows in one direction;
a second terminal switchably coupled to the control voltage generator, drawing the first current from the control voltage generator when the first current flows in another direction;
a first current source generating a second current;
a first analog switch connected to the first current source and the first terminal, selectively feeding the second current to the first terminal, thereby increasing the first current;
a second current source generating a third current;
a second analog switch connected to the second current source and the first terminal, selectively drawing the second current from the first terminal, thereby decreasing the first current;
a third current source generating a fourth current;
a third analog switch connected to the third current source and the second terminal, selectively drawing the fourth current from the second terminal, thereby increasing the first current;
a fourth current source generating a fifth current; and
a fourth analog switch connected to the fourth current source and the second terminal, selectively feeding the fifth current to the second terminal, thereby decreasing the first current.

2. The local oscillator circuit of claim 1, wherein the current generator further comprises:
a decoder decoding the frequency setting to generate a first control signal controlling the first and third analog switches and a second control signal controlling the second and fourth analog switches.

3. The local oscillator circuit of claim 2, wherein the current generator further comprises:
an input terminal receiving a current switching signal; and
a logic gate inserted between the decoder and the second and fourth analog switches, performing a logic operation on the second control signal and the current switching signal.

4. A local oscillator circuit having a selectable frequency setting, comprising:
a control voltage generator receiving a first current having a magnitude and a direction, generating a control voltage, and raising and lowering the control voltage according to the first current;
a voltage-controlled oscillator generating an output signal having a frequency responsive to said control voltage;
a frequency divider dividing the frequency of the output signal of the voltage-controlled oscillator by a frequency division ratio selectable according to said frequency setting, thereby generating a divided signal;
a phase detector comparing phases of the divided signal and a reference frequency signal to generate a phase detection signal; and
a current generator generating the first current, switching the direction of the first current according to the phase detection signal, switching the magnitude of the first current according to the frequency setting, thereby bringing the frequency of the output signal of the voltage-controlled oscillator to said frequency setting;
wherein the current generator comprises:
a first terminal switchably coupled to the control voltage generator, feeding the first current to the control voltage generator when the first current flows in one direction;
a second terminal switchably coupled to the control voltage generator, drawing the first current from the control voltage generator when the first current flows in another direction;
a current source generating a second current;
a first analog switch connected to the current source and the first terminal, selectively supplying the second current to the first terminal as part of the first current;
a second analog switch connected to the current source and the second terminal, selectively supplying the second current to the second terminal as part of the first current.

5. The local oscillator circuit of claim 4, wherein the second current flows in said one direction, the first analog switch being turned on to increase the magnitude of the first current when the first current flows in said one direction, and the second analog switch being turned on to decrease the magnitude of the first current when the first current flows in said another direction.

6. The local oscillator circuit of claim 4, wherein the second current flows in said another direction, the first analog switch being turned on to decrease the magnitude of the first current when the first current flows in said one direction, and the second analog switch being turned on to increase the magnitude of the first current when the first current flows in said another direction.

7. The local oscillator circuit of claim 4, wherein the current generator further comprises:
a decoder decoding the frequency setting to generate a first control signal controlling the first analog switch and a second control signal controlling the second analog switch.

8. The local oscillator circuit of claim 7, wherein the current generator further comprises:
an input terminal receiving a current switching signal; and
a first logic gate inserted between the decoder and the first analog switch, performing a logic operation on the control signal and the current switching signal; and
a second logic gate inserted between the decoder and the second analog switch, performing a logic operation on the control signal and the current switching signal.

9. A local oscillator circuit having a selectable frequency setting, comprising:
a control voltage generator receiving a first current having a magnitude and a direction, generating a control voltage, and raising and lowering the control voltage according to the first current;
a voltage-controlled oscillator generating an output signal having a frequency responsive to said control voltage;
a frequency divider dividing the frequency of the output signal of the voltage-controlled oscillator by a frequency division ratio selectable according to said frequency setting, thereby generating a divided signal;
a phase detector comparing phases of the divided signal and a reference frequency signal to generate a phase detection signal; and a current generator generating the first current, switching the direction of the first current according to the phase detection signal, switching the magnitude of the first current according to the frequency setting, thereby bringing the frequency of the output signal of the voltage-controlled oscillator to said frequency setting;

wherein the current generator comprises:

a current source circuit generating the first current according to a reference current; and a compensation circuit generating the reference current, the compensation circuit setting the reference current to a value that compensates for fabrication variability in frequency sensitivity of the voltage-controlled oscillator; and wherein the compensation circuit comprises:

a reference voltage generator generating a plurality of reference voltages;

a plurality of comparators comparing said control voltage with the plurality of reference voltages to generate a plurality of comparison result signals;

a latch circuit latching the plurality of comparison result signals; and a reference current generating circuit generating the reference current according to the comparison result signals latched in the latch circuit.

10. The local oscillator circuit of claim 9, wherein the voltage-controlled oscillator is calibrated to oscillate at a first frequency when the control voltage is within a certain range, after which the frequency setting of the local oscillator is changed to a second frequency different from the first frequency, and the comparison result signals are latched when the local oscillator circuit has brought the output frequency of the voltage-controlled oscillator to the second frequency.

11. The local oscillator circuit of claim 9, wherein the plurality of comparators are disabled after the comparison result signals have been latched.

* * * * *